(12) United States Patent
Jia et al.

(10) Patent No.: US 11,158,500 B2
(45) Date of Patent: Oct. 26, 2021

(54) PLASMA ENHANCED DEPOSITION PROCESSES FOR CONTROLLED FORMATION OF OXYGEN CONTAINING THIN FILMS

(71) Applicant: ASM IP Holding B.V., Almere (NL)

(72) Inventors: Lingyun Jia, Helsinki (FI); Viljami J. Pore, Helsinki (FI); Marko Tuominen, Helsinki (FI); Sun Ja Kim, Helsinki (FI); Oreste Madia, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/603,555

(22) PCT Filed: May 3, 2018

(86) PCT No.: PCT/US2018/030974
§ 371 (c)(1),
(2) Date: Oct. 7, 2019

(87) PCT Pub. No.: WO2018/204709
PCT Pub. Date: Nov. 8, 2018

(65) Prior Publication Data
US 2020/0395211 A1 Dec. 17, 2020

Related U.S. Application Data

(60) Provisional application No. 62/502,118, filed on May 5, 2017.

(51) Int. Cl.
*H01L 21/02* (2006.01)
*C23C 16/40* (2006.01)
(Continued)

(52) U.S. Cl.
CPC ........ *H01L 21/02274* (2013.01); *C23C 16/40* (2013.01); *C23C 16/401* (2013.01);
(Continued)

(58) Field of Classification Search
None
See application file for complete search history.

(56) References Cited

U.S. PATENT DOCUMENTS

| 3,708,728 A | 1/1973 | Sterling et al. |
| 3,925,337 A | 12/1975 | Heiberger |

(Continued)

FOREIGN PATENT DOCUMENTS

| CN | 104900513 | 9/2015 |
| EP | 0387403 | 9/1990 |

(Continued)

OTHER PUBLICATIONS

File History of U.S. Appl. No. 17/072,480, filed Oct. 16, 2020.
(Continued)

*Primary Examiner* — Jiong-Ping Lu
(74) *Attorney, Agent, or Firm* — Knobbe, Martens, Olson & Bear LLP

(57) ABSTRACT

Methods for controlling the formation of oxygen containing thin films, such as silicon oxycarbide (SiOC) and silicon oxycarbonitride (SiOCN) thin films, on a substrate in a reaction space are provided. The methods can include at least one plasma enhanced atomic layer deposition (PEALD) cycle including alternately and sequentially contacting the substrate with a silicon precursor that comprises oxygen and a second reactant that does not include oxygen. In some embodiments the plasma power can be selected from a range to achieve a desired step coverage or wet etch rate ratio (WERR) for films deposited on three dimensional features.

18 Claims, 11 Drawing Sheets

(51) Int. Cl.
*C23C 16/455* (2006.01)
*H01L 21/3065* (2006.01)

(52) U.S. Cl.
CPC ........ *C23C 16/402* (2013.01); *C23C 16/4554* (2013.01); *C23C 16/45525* (2013.01); *C23C 16/45536* (2013.01); *C23C 16/45542* (2013.01); *H01L 21/0228* (2013.01); *H01L 21/02126* (2013.01); *H01L 21/02208* (2013.01); *H01L 21/02216* (2013.01); *H01L 21/3065* (2013.01)

(56) References Cited

U.S. PATENT DOCUMENTS

| | | |
|---|---|---|
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,159,871 A | 12/2000 | Loboda et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,410,462 B1 | 6/2002 | Yang et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,583,048 B1 | 6/2003 | Vincent et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,074,690 B1 | 7/2006 | Gauri et al. |
| 7,115,534 B2 | 10/2006 | Nguyen et al. |
| 7,115,974 B2 | 10/2006 | Wu et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,776,396 B2 | 8/2010 | Kobrin et al. |
| 7,794,798 B2 | 9/2010 | Hautala |
| 7,824,492 B2 | 11/2010 | Tois et al. |
| 8,217,446 B2 | 7/2012 | Fukuzumi et al. |
| 8,647,993 B2 | 2/2014 | LaVoie et al. |
| 8,703,624 B2 | 4/2014 | Yang et al. |
| 9,111,746 B2 | 8/2015 | Ranjan et al. |
| 9,171,736 B2 | 10/2015 | Raley et al. |
| 9,243,324 B2 | 1/2016 | Bowen et al. |
| 9,425,038 B2 | 8/2016 | Shimizu |
| 9,425,097 B1 | 8/2016 | Bouche et al. |
| 9,443,718 B2 | 9/2016 | Harada et al. |
| 9,455,138 B1 | 9/2016 | Fukazawa et al. |
| 9,472,391 B2 | 10/2016 | Shimamoto et al. |
| 9,784,695 B2 | 10/2017 | Blendl |
| 9,786,491 B2 | 10/2017 | Suzuki et al. |
| 9,786,492 B2 | 10/2017 | Suzuki et al. |
| 10,008,428 B2 | 6/2018 | Kang et al. |
| 10,424,476 B2 | 9/2019 | Suzuki et al. |
| 10,424,477 B2 | 9/2019 | Niskanen et al. |
| 10,453,675 B2 | 10/2019 | O'Neill |
| 10,600,637 B2 * | 3/2020 | Suzuki ................ C23C 16/4408 |
| 10,787,591 B2 | 9/2020 | Tsotsis et al. |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1 | 1/2003 | Raaijmakers |

(56) References Cited

U.S. PATENT DOCUMENTS

| | | |
|---|---|---|
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0119305 A1 | 6/2003 | Huang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0072427 A1 | 3/2007 | Fukushima et al. |
| 2007/0148350 A1 | 6/2007 | Rahtu et al. |
| 2007/0218670 A1 | 9/2007 | Ishizaka |
| 2007/0232082 A1 | 10/2007 | Balseanu et al. |
| 2007/0251444 A1 | 11/2007 | Gros-Jean et al. |
| 2008/0081470 A1 | 4/2008 | Clark |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0148903 A1 | 6/2010 | Yin et al. |
| 2010/0239742 A1 | 9/2010 | Larson-Smith et al. |
| 2010/0297545 A1 | 11/2010 | Yoo et al. |
| 2011/0159202 A1 | 6/2011 | Matsushita et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0119283 A1 | 5/2012 | Lee et al. |
| 2012/0141770 A1 | 6/2012 | Cadet et al. |
| 2012/0208347 A1 | 8/2012 | Hwang et al. |
| 2012/0269962 A1 | 10/2012 | Blomberg et al. |
| 2013/0034963 A1 | 2/2013 | Chung et al. |
| 2013/0078454 A1 | 3/2013 | Thompson et al. |
| 2013/0084714 A1 | 4/2013 | Oka et al. |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0330935 A1 | 12/2013 | Varadarajan |
| 2014/0030432 A1 | 1/2014 | Leu et al. |
| 2014/0048131 A1 | 2/2014 | Tanaka et al. |
| 2014/0272194 A1 | 9/2014 | Xiao et al. |
| 2014/0273477 A1 | 9/2014 | Niskanen et al. |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0367764 A1 | 12/2014 | Lee et al. |
| 2015/0087156 A1 | 3/2015 | Kamimura et al. |
| 2015/0118865 A1 | 4/2015 | Shimizu |
| 2015/0126042 A1 | 5/2015 | Pasquale et al. |
| 2015/0214103 A1 | 7/2015 | Matsuda |
| 2015/0217240 A1 | 8/2015 | Van Tuel et al. |
| 2015/0217330 A1 | 8/2015 | Haukka et al. |
| 2015/0252477 A1 | 9/2015 | Nguyen et al. |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2015/0380302 A1 | 12/2015 | Mountsier et al. |
| 2016/0064281 A1 | 3/2016 | Izumi et al. |
| 2016/0093485 A1 | 3/2016 | Kobayashi et al. |
| 2016/0225616 A1 | 8/2016 | Li et al. |
| 2016/0336338 A1 | 11/2016 | Song et al. |
| 2017/0140924 A1 | 5/2017 | Suzuki et al. |
| 2017/0213726 A1 | 7/2017 | Saley et al. |
| 2017/0309476 A1 | 10/2017 | Venkatasubramanian et al. |
| 2017/0323782 A1* | 11/2017 | Suzuki ................ H01L 21/0228 |
| 2017/0352680 A1 | 12/2017 | Shin et al. |
| 2017/0365462 A1 | 12/2017 | Varadarajan |
| 2018/0005814 A1 | 1/2018 | Kumar et al. |
| 2018/0013078 A1 | 1/2018 | Lee et al. |
| 2018/0122742 A1 | 5/2018 | Ha et al. |
| 2018/0151355 A1 | 5/2018 | Fukazawa |
| 2018/0182618 A1 | 6/2018 | Blanquart et al. |
| 2018/0350587 A1 | 12/2018 | Jia et al. |

FOREIGN PATENT DOCUMENTS

| | | |
|---|---|---|
| EP | 0394054 | 10/1990 |
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1158070 | 11/2001 |
| EP | 1167567 | 1/2002 |
| EP | 2620440 | 7/2013 |
| EP | 3196336 | 7/2017 |
| JP | 58-033841 | 2/1983 |
| JP | H06-037041 | 2/1994 |
| JP | H06-069157 | 3/1994 |
| JP | H07-230957 | 8/1995 |
| JP | H08-264530 | 10/1996 |
| JP | H0955365 | 2/1997 |
| JP | 09-087857 | 3/1997 |
| JP | 2003342731 | 12/2003 |
| JP | 2004-288979 | 10/2004 |
| JP | 2006-040936 | 2/2006 |
| JP | 2009-083511 | 4/2009 |
| JP | 2010219533 | 9/2010 |
| JP | 2014135475 | 7/2014 |
| JP | 2014229834 | 12/2014 |
| JP | 2015144268 | 8/2015 |
| JP | 2015523917 | 8/2015 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| KR | 2018-005128 | 1/2018 |
| TW | 2010210202 | 1/2010 |
| TW | 201403759 | 1/2014 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |

(56) References Cited

FOREIGN PATENT DOCUMENTS

| | | |
|---|---|---|
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2006/097525 | 9/2006 |
| WO | WO 2007/041089 | 4/2007 |
| WO | WO 2008/051851 | 5/2008 |
| WO | WO 2008/121478 | 10/2008 |
| WO | WO 2008/137399 | 11/2008 |
| WO | WO 2013/043330 | 3/2013 |
| WO | WO 2018/204709 | 11/2018 |
| WO | WO 2018/213018 | 11/2018 |

OTHER PUBLICATIONS

File History of U.S. Appl. No. 16/811,258, filed Mar. 6, 2020.
1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[Anon], Sep. 19, 2005.
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).
Chookarjorn et al, "Design of Stable Nanocrystalline Alloys," Science Magazine, vol. 337, pp. 951-954, Aug. 24, 2012.
Closser et al., "Molecular Layer Deposition of a Highly Stable Oxycarbide Thin Film Using an Organic Chlorosilane and Water", ACS Appl. Mater. Interfaces 2018, 10, pp. 24266-24274.
Elers et al., NbC15 as a precursor in atomic layer epitaxy, Applied Surface Science, Jul. 9, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.
File History of U.S. Appl. No. 14/939,984, filed Nov. 12, 2015.
File History of U.S. Appl. No. 15/707,749, filed Sep. 18, 2017.
File History of U.S. Appl. No. 16/576,328, filed Sep. 19, 2019.
File History of U.S. Appl. No. 15/707,878, filed Sep. 18, 2017.
File History of U.S. Appl. No. 15/588,026, filed May 5, 2017.
File History of U.S. Appl. No. 15/787,342, filed Oct. 18, 2017.
File History of U.S. Appl. No. 15/951,626, filed Apr. 12, 2018.
File History of U.S. Appl. No. 15/951,644, filed Apr. 12, 2018.
File History of U.S. Appl. No. 16/208,350, filed Dec. 3, 2018.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Gallis et al., "White light emission from amorphous silicon oxycarbide (a-SiCxOy) thin films: Role of composition and postdeposition annealing", Applied Physics Letters 97, 2010, pp. 0810905-1-0810905-3.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of ZnS1-xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., Atomic-layer-deposited WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS 46th International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Kukli et al., Properties of (Nb1-xTax)2O5 Solid Solutions and (Nb1-xTax)2O5-ZrO2 Nanolaminates Growth by Atomic Layer Epitaxy, NanoStructured Materials, 1997, vol. 8, pp. 785-793.
Lai et al., Precursors for Organometallic Chemical Vapor Deposition of Tungsten Carbide Films, Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Lee et al., "Characteristics of low-k SiOC films deposited via atomic layer deposition", Thin Solid Films 645 (2018), pp. 334-339.
Leskelä et al., ALD precursor chemistry: Evolution and future challenges, Jour. Phys. IV France 9, 1999, pp. 837-852.

(56) References Cited

OTHER PUBLICATIONS

Ludviksson et al., Low-Temperature Thermal CVD of Ti—Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J. Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., CU(THD)2 As Copper Source in Atomic Layer Epitaxy, Electrochemical Society Proceedings, vol. 97-25, (1997) pp. 1529-1536.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and HN3, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from TiI4 and NH3, J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and Al2O3 films deposited by atomic layer deposition, Chem. Vapor Deposition, 1999, vol. 5, pp. 7-9.
Ritala et al., Surface roughness reduction in atomic layer epitaxy grown of titanium dioxide thin films. Thin Solid Films, vol. 249, pp. 155-162 (1994).
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.
Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.
Tulhoff et al., Ullmann's Encyclopedia of Industrial Chemistry, 5th, Completely Revised Edition, 1986, vol. A5, pp. 61-77.
U.S. Appl. No. 10/049,125, filed Aug. 20, 2002 file history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 file history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 file history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 file history, including but not limited to Office Action dated Sep. 28, 2007.
U.S. Appl. No. 11/288,872, filed Nov. 28, 2005 file history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 file history, including but not limited to, Office Action dated Sep. 4, 2008, Office Action dated May 28, 2009, and Notice of Allowance dated Sep. 4, 2009.
U.S. Appl. No. 14/939,984, filed Nov. 12, 2015 file history, including but not limited to, Office Action dated Feb. 3, 2017, and Notice of Allowance dated Jun. 7, 2017.
U.S. Appl. No. 15/342,943 filed, Nov. 3, 2016 file history, including but not limited to Notice of Allowance dated Jun. 13, 2017.
U.S. Appl. No. 14/255,799, filed Apr. 17, 2014 file history, including but not limited to, Office Action dated Dec. 1, 2016, Final Office Action dated Aug. 29, 2017, and Advisory Action dated Dec. 21, 2017.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wong et al., Barriers for copper interconnections, Solid State Technology, 1999, pp. 1-7.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.
Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.
Ibrahim et al., "Organosilica bis(triethoxysilyl)ethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.
Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.

* cited by examiner

101

121
Contact substrate with vapor phase precursor that comprises oxygen

131
Remove excess silicon precursor and reaction byproducts, if any, from the substrate surface

141
Select plasma power to achieve desired step coverage and/or WERR

151
Contact substrate with second reactant comprising reactive species generated by plasma

161
Remove excess second reactant and reaction byproducts, if any, from the substrate surface

171

FIG. 1B

PLASMA ENHANCED DEPOSITION PROCESSES FOR CONTROLLED FORMATION OF OXYGEN CONTAINING THIN FILMS

REFERENCE TO RELATED APPLICATION

This application claims priority to U.S. Provisional application No. 62/502,118, filed May 5, 2017.

BACKGROUND

Field

The present disclosure relates generally to the field of semiconductor device manufacturing and, more particularly, to processes for the controlled formation of thin films having desirable properties.

Description of the Related Art

There is increasing need for dielectric materials with relatively low dielectric constant (k) values and relatively low acid-based wet etch rates. Silicon oxycarbide or silicon oxycarbonitride (SiOCN) may satisfy certain of these requirements. Typically, deposition processes for SiOC or SiOCN require oxygen plasma. Further, the ability to deposit or form a film on one surface of a substrate, such as a semiconductor workpiece, relative to another different surface, such as a surface comprising a different material or different orientation is desirable. For example, selective deposition may reduce the number of steps involved in semiconductor device fabrication.

SUMMARY OF THE INVENTION

The present application relates to the deposition of oxides on a substrate by plasma enhanced atomic layer deposition (PEALD). In some embodiments the PEALD process does not utilize oxygen plasma or other reactive oxygen species.

In one aspect, methods are provided for controlling the step coverage of a silicon oxycarbide (SiOC) thin film on a three-dimensional feature of a substrate. The SiOC film may be deposited by a PEALD process comprising one or more deposition cycles in which the substrate is contacted with a vapor-phase silicon precursor that comprises oxygen, and subsequently contacted with a second plasma reactant. In some embodiments the second plasma reactant comprises oxygen-free plasma. The second plasma reactant may be generated in a reactant gas at a plasma power of 650 W or less.

In some embodiments the SiOC thin film has a step coverage on the three-dimensional feature of 20% or greater. In some embodiments the step coverage is form about 20% to about 1000%. In some embodiments the three-dimensional feature has an aspect ratio of from about 1 to about 3.

In some embodiments the silicon precursor comprises oxygen and no other reactant in the deposition cycle comprises oxygen. In some embodiments the silicon precursor comprises as least one alkoxy group. For example, the silicon precursor may comprise 3-methoxypropyltrimethoxysilane (MPTMS).

In some embodiments the second reactant comprises hydrogen plasma, hydrogen atoms, hydrogen radicals or hydrogen ions.

In some embodiments a ratio of a wet etch rate of the SiOC film formed on a vertical surface of the three dimensional feature to a wet etch rate of the SiOC film formed on a horizontal surface of the three dimensional feature of from about 0.2 to about 15.

In some embodiments, the method further comprises subsequently exposing the deposited SiOC film to at least one reactive species generated by a plasma formed in a gas comprising $H_2$, $N_2$ or $O_2$. Such exposure may reduce the wet etch rate of the SiOC on a vertical surface of the three-dimensional structure, or reduce a thickness of the SiOC film on a horizontal surface while increasing the thickness of the SiOC film on a vertical surface.

In some embodiments the methods further comprise etching the deposited SiOC films. Etching may comprise removing substantially all of the SiOC from a vertical surface but not from a horizontal surface of the three-dimensional feature.

In some embodiments, methods are provided for selectively depositing SiOC on a first horizontal surface of a three-dimensional structure on a substrate relative to second vertical surface of the structure. The process may comprise a PEALD process that utilizes a silicon reactant comprising oxygen and an oxygen-free plasma as reactants. The SiOC deposited on the horizontal surface may have an etch rate lower than that deposited on the vertical surface, such that etching of the deposited SiOC removes a greater amount of SiOC from the vertical surface than from the horizontal surface. In some embodiments all SiOC is removed from the vertical surface but some SiOC remains on the horizontal surface. Etching may comprise exposing the deposited SiOC to 0.5% dilute HF. In other embodiments etching may comprise exposing the deposited SiOC to a plasma reactant.

In some embodiments the PEALD process comprises alternately and sequentially contacting the substrate with a vapor phase silicon alkoxide precursor and at least one reactive species generated by a plasma formed in a gas comprising hydrogen.

BRIEF DESCRIPTION OF THE DRAWINGS

FIG. 1B is a process flow diagram for the controlled formation of an oxide thin film by a PEALD process according to some embodiments.

DETAILED DESCRIPTION

Figure 1A:
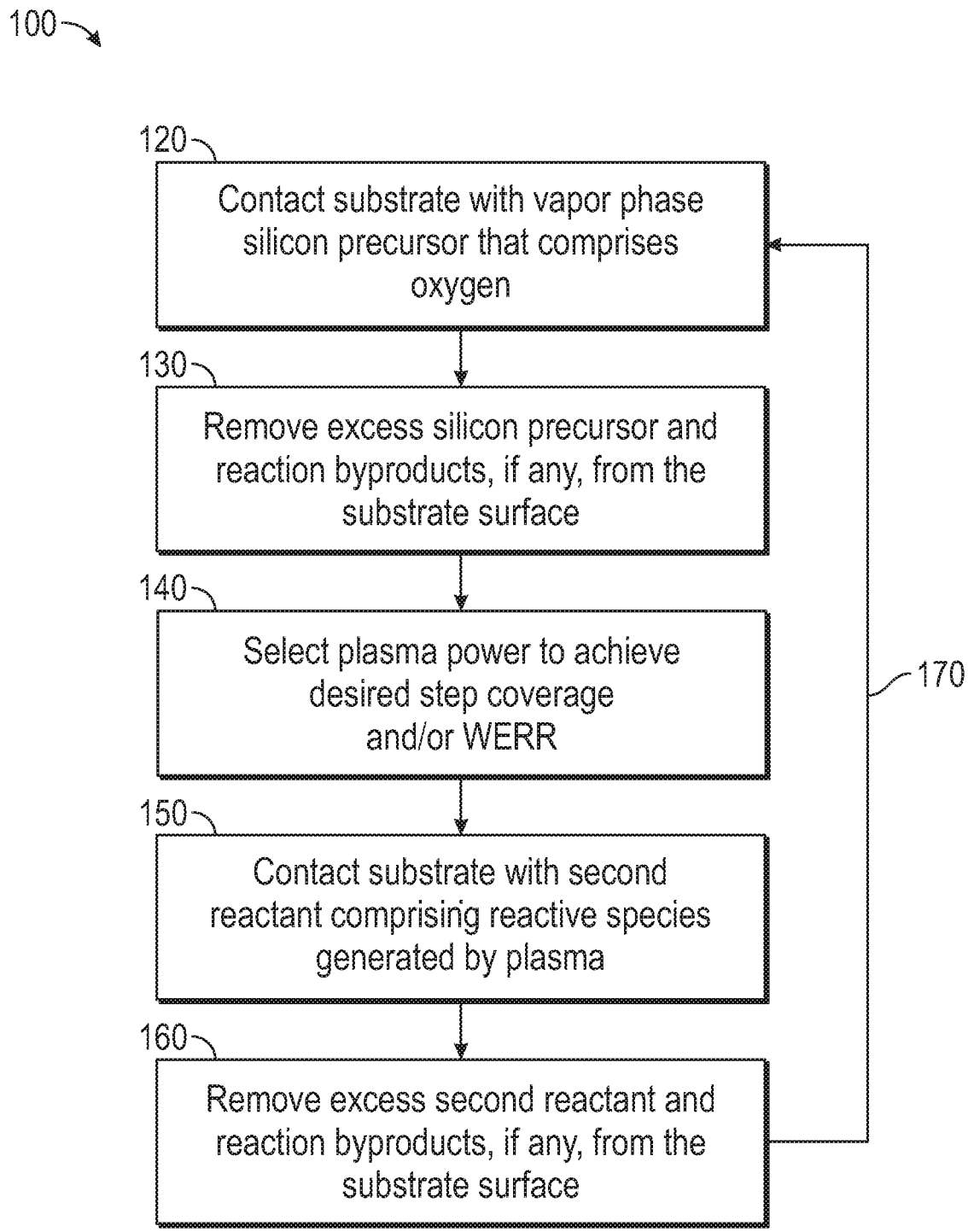
FIG. 1A is a process flow diagram for the controlled formation of a silicon oxycarbide (SiOC) thin film by a plasma enhanced atomic layer deposition (PEALD) process according to some embodiments.

In some embodiments the formation of films comprising oxygen, such as SiOC, SiOCN, $TiO_2$, or $Al_2O_3$ films can be controlled by plasma enhanced atomic layer deposition (PEALD) processes that use a first reactant that comprises oxygen and a second reactant comprising oxygen-free plasma. In some embodiments the second reactant comprises species from a plasma generated in a gas that does not comprise oxygen.

Silicon oxycarbide (SiOC) films have a wide variety of applications, as will be apparent to the skilled artisan, for example in integrated circuit fabrication. More specifically, SiOC films that display a low etch rate have a wide variety of application, both in the semiconductor industry and outside of the semiconductor industry. SiOC films may be useful as, for example, etch stop layers, sacrificial layers, low-k spacers, anti-reflection layers (ARL), and passivation layers.

According to some embodiments of the present disclosure, various SiOC films, precursors, and methods for depositing said films are provided. In some embodiments the SiOC films have a relatively low wet etch rate, for example in acid-based etching solutions, such as dHF.

In some embodiments SiOC thin films are deposited on a substrate by plasma-enhanced atomic layer deposition (PEALD) processes that include a silicon precursor comprising at least one alkoxy group and an oxygen-free plasma. In some embodiments SiOC thin films are not deposited by liquid phase methods. In some embodiments a SiOC thin film is deposited over a three dimensional structure, such as a fin in the formation of a finFET device.

In some embodiments SiOC thin films are deposited on a substrate comprising a three dimensional structure or feature and one or more of the properties of the film, such as the thickness of the film deposited on vertical surfaces of the three dimensional structure, the thickness of the film deposited on the horizontal surfaces of the three dimensional structure, the wet etch rate (WER) of the film deposited on vertical surfaces of the three dimensional structure, and/or the WER of the film deposited on horizontal surfaces of the three dimensional structure may be controlled by selecting an appropriate plasma power during a plasma enhanced ALD (PEALD) process as described herein. In some embodiments the plasma power is controlled to achieve differential effects on different surfaces, such as vertical and horizontal surfaces of a three dimensional structure. In some embodiments the aspect ratio of a three dimensional feature over which a SiOC film is deposited may influence the plasma power that can be selected to achieve a desired results, such as a desired thickness, wet etch rate for a portion of a deposited SiOC film, and/or ratio of thicknesses and/or etch rates for portions of the film deposited on different surfaces.

In some embodiments the step coverage of the SiOC film deposited on a three dimensional feature may be controlled by selecting an appropriate plasma power during a PEALD process for three dimensional features having an aspect ratio of from about 1 to about 10. In some embodiments the plasma power can be selected to achieve a desired step coverage of from about 25% to about 1000% or more.

In some embodiments the ratio of the etch rate, such as the WER, of the SiOC film deposited a vertical surface, such as a sidewall of a three dimensional feature, to the etch rate of the SiOC film deposited on a horizontal surface, such as a top surface of a three dimensional feature may be controlled by selecting an appropriate plasma power as described herein. In some embodiments the etch rate is controlled by depositing a film that has different etch rates on different surfaces of a three dimensional feature, for example by depositing a film that has different etch rates on vertical and horizontal surfaces of a three dimensional feature. In some embodiments the plasma power may be selected to achieve a give desired WER ratio (WERR) of from about 0.2 to about 15.

In some embodiments a deposited SiOC film, for example a SiOC film deposited to achieve a desired step coverage on a three dimensional structure or a desired WERR may be subjected to a post deposition treatment, such as a plasma treatment and/or an etch.

In some embodiments the post deposition treatment comprises a plasma treatment in which the SiOC film is contacted with a plasma reactant for a desired period of time. In some embodiments the SiOC film is exposed to one or more of a hydrogen, oxygen or nitrogen plasma.

In some embodiments the post deposition plasma treatment may differentially change the thickness of an oxide film, such as a SiOC film, on a first surface and a second, different surface. For example, the post deposition plasma treatment may reduce the thickness of an SiOC film on a vertical surface of the substrate and a horizontal surface of the substrate such that the thickness of the SiOC film deposited on the horizontal surface is reduced substantially more than the thickness of the SiOC film deposited on the first surface.

In some embodiments a post deposition plasma treatment may decrease the thickness on one surface while increasing the thickness of the film on a different surface. For example, post deposition plasma treatment of an oxide film deposited on a trench may decrease the thickness of the oxide film on the top of the trench while increasing the thickness of the film on the sidewall and/or at the bottom of the trench.

In some embodiments a post deposition plasma treatment may improve conformality of an oxide film on a three dimensional structure. In some embodiments, a post deposition plasma treatment may increase the step coverage of an oxide film on a three-dimensional structure, such as a trench. In some embodiments the step coverage may be increased from less than 1 to greater than 1 and even up to 2. For example, the step coverage of an oxide film, such as a SiOC film on a trench, may be increased by exposure to a plasma reactant.

In some embodiments the post deposition treatment comprises a plasma treatment that reduces the WER of an oxide film on a first surface of a feature on the substrate, such as a vertical or sidewall surface of a trench. In some embodiments the WER of an oxide such as SiOC on the sidewall of a trench may be reduced by 30%, 40%, 50%, 60%, 70%, 80%, 90%, 95%, or even 99% relative to the WER of the sidewall in the absence of the post deposition plasma treatment. Wet etch rate maybe measured in dHF acid as is known in the art.

In some embodiments the WER of an oxide film deposited on a first surface is reduced more than the WER of a second surface when both surfaces are contacted with a plasma reactant in a post deposition plasma treatment. For example, in some embodiments the WER of a SiOC film on both a first vertical surface and a second horizontal surface of a three dimensional feature are reduced by a post deposition plasma treatment, but the WER of the SiOC film on the first surface is reduced substantially more than the WER of the SiOC film on the second surface.

In some embodiments the post deposition plasma treatment may comprise exposing the deposited oxide film, such as a SiOC film on a three-dimensional structure, to a plasma generated in a gas comprising $H_2$, $O_2$ or $N_2$ $N_2O$, NO, $NO_2$, $NH_3$, $CO_2$, or CO. For example, the deposited oxide film may be exposed to a plasma generated in a combination of $O_2$ and Ar or a combination of $N_2$ and Ar. In some embodiments the plasma may be generated using a plasma power of about 10 W to about 5000 W, from about 100 W to about 1000 W, about 200 W to about 800 W, about 300 to 800 W, or about 300 W to about 500 W. In some embodiments the plasma power is about 300 W. In some embodiments the post-deposition plasma treatment may be conducted for about 0.5 to 60 minutes, about 1 to 30 minutes, about 3 to 15 minutes, or about 5 to 10 minutes.

In some embodiments an oxide film deposited on a three-dimensional structure is exposed to a hydrogen plasma, such as a plasma generated in a mixture of Ar and $H_2$ gas. In some embodiments the plasma is generated with a plasma power of about 10 W to about 5000 W, about 100 W to 1000 W, about 300 to 900 W, about 300 W to about 500 W, or about 330 to 850 W. In some embodiments the oxide film is exposed for a period of about 1 to 1000 s, 2 to 500 s, 5 to 200 s, or 10 to 100 s.

In some embodiments, the plasma may be provided cyclically during the post deposition plasma treatment process, with the reaction chamber being purged between pulses of the plasma. In some embodiments, 1, 2, 5, 10, 20, 30, 40, 50, 100, 200, 500 or 1000 or more cycles of plasma post deposition treatment are carried out on a deposited SiOC film.

In some embodiments the post-deposition treatment may be provided at intervals during the deposition process. For example the plasma may be provided after a certain number of deposition cycles, such as every 5 deposition cycle, every $10^{th}$ deposition cycle, every $25^{th}$ deposition cycle or every $50^{th}$ deposition cycle.

In some embodiments where the post deposition treatment comprises an etch, such as a wet etch, the post deposition treatment may remove substantially all of the deposited SiOC from a first surface, such as a vertical surface of the substrate and may not remove substantially all of the deposited SiOC from a second surface, such as a horizontal surface of the substrate.

In some embodiments where the post deposition treatment comprises an etch, such as an etch comprising reactive species, the post deposition treatment may remove substantially all of the deposited SiOC from a first surface, such as a horizontal surface of the substrate and may not remove substantially all of the deposited SiOC from a second surface, such as a vertical surface of the substrate.

The formula of the silicon oxycarbide films is generally referred to herein as SiOC for convenience and simplicity. As used herein, SiOC is not intended to limit, restrict, or define the bonding or chemical state, for example the oxidation state of any of Si, O, C, and/or any other element in the film. Further, in some embodiments SiOC thin films may comprise one or more elements in addition to Si, O, and/or C, such as S and/or N. That is, in some embodiments an SiOC film may comprise, for example silicon oxycarbonitride (SiOCN) or silicon oxycarbosulfide (SiOCS). In some embodiments the SiOC films may comprise Si—C bonds and/or Si—O bonds. In some embodiments the SiOC films may comprise Si—C bonds and Si—O bonds and may not comprise Si—N bonds. However, in some embodiments the SiOC films may comprise Si—C bonds, Si—O bonds, and/or Si—N bonds. In some embodiments the SiOC films may comprise Si—S bonds in addition to Si—C and/or Si—O bonds. In some embodiments the SiOC films may comprise more Si—O bonds than Si—C bonds, for example a ratio of Si—O bonds to Si—C bonds may be from about 1:1 to about 10:1. In some embodiments the SiOC may comprise from about 0% to about 40% carbon on an atomic basis. In some embodiments the SiOC may comprise from about 0.1% to about 40%, from about 0.5% to about 30%, from about 1% to about 30%, or from about 5% to about 20% carbon on an atomic basis. In some embodiments the SiOC films may comprise from about 0% to about 70% oxygen on an atomic basis. In some embodiments the SiOC may comprise from about 10% to about 70%, from about 15% to about 50%, or from about 20% to about 40% oxygen on an atomic basis. In some embodiments the SiOC films may comprise about 0% to about 50% silicon on an atomic basis. In some embodiments the SiOC may comprise from about 10% to about 50%, from about 15% to about 40%, or from about 20% to about 35% silicon on an atomic basis. In some embodiments the SiOC may comprise from about 0.1% to about 40%, from about 0.5% to about 30%, from about 1% to about 30%, or from about 5% to about 20% sulfur on an atomic basis. In some embodiments the SiOC films may not comprise nitrogen. In some other embodiments the SiOC films may comprise from about 0% to about 10% nitrogen on an atomic basis (at %).

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

In some embodiments a suitable substrate may comprise a wafer, such as a semiconductor wafer, for example a silicon wafer. In some embodiments the substrate may comprise a wafer having a diameter of equal to or greater than about 150 mm, equal to or greater than 200 mm, equal to or greater than 300 mm, or equal to or greater than 450 mm.

In some embodiments, plasma enhanced ALD (PEALD) processes are used to deposit oxygen containing films, such as oxide films, metal oxide films, and/or SiOC films. In some embodiments PEALD processes as described herein do not use oxygen plasma. In some embodiments PEALD processes as described herein use oxygen-free plasma. In some embodiments PEALD processes as described herein do not include a reactant comprising oxygen plasma. In some embodiments PEALD processes as described herein may use hydrogen plasma. In some embodiments PEALD processes as described herein may include a reactant comprising hydrogen plasma.

Briefly, a substrate or workpiece is placed in a reaction chamber and subjected to alternately repeated surface reactions. In some embodiments, thin SiOC films are formed by repetition of a self-limiting ALD cycle. In some embodiments, for forming SiOC films, each ALD cycle comprises at least two distinct phases. The contacting and removal of a reactant or precursor from the substrate may be considered a phase. In a first phase, a vapor phase first reactant or precursor comprising silicon contacts the substrate and forms no more than about one monolayer on the substrate surface. This reactant is also referred to herein as "the silicon precursor," "silicon-containing precursor," or "silicon reactant" and may be, for example, a silicon alkoxide compounds, such as bis(triethoxysilyl)ethane (BTESE) or 3-methoxypropyltrimethoxysilane (MPTMS). In some embodiments excess first vapor phase reactant and any reaction byproducts are removed from the proximity of the substrate surface. The first vapor phase reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber.

In a second phase, a second reactant comprising a reactive species contacts the substrate and may convert adsorbed silicon species to SiOC. In some embodiments the second reactant comprises a hydrogen precursor. In some embodiments, the reactive species comprises an excited species. In some embodiments the second reactant comprises species from a plasma generated in a gas that does not comprise oxygen. In some embodiments the second reactant comprises a species from an oxygen-free plasma. In some embodiments the second reactant comprises a species from a hydrogen containing plasma. In some embodiments, the second reactant comprises hydrogen radicals, hydrogen atoms and/or hydrogen plasma. The second reactant may comprise other species that are not hydrogen precursors. In some embodiments, the second reactant may comprise a species from a noble gas, such as one or more of He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma. In some embodiments the reactive species generated from noble gases may affect the amount or extent of any damage to the underlying substrate. A skilled artisan will be able to select a noble gas or gases suitable for a particular application. In some embodiments a gas that is used to form a plasma may flow constantly throughout the deposition process but only be activated intermittently. In some embodiments a gas that is used to form a plasma does not comprise oxygen. In some embodiments the adsorbed silicon precursor is not contacted with a reactive species generated by a plasma from oxygen. In some embodiments the adsorbed substrate is not contacted with reactive oxygen species.

In some embodiments a second reactant comprises reactive species generated in a gas that does not comprise oxygen. For example in some embodiments a second reactant may comprise a plasma generated in a gas that does not comprise oxygen. In some embodiments the second reactant may be generated in a gas comprising less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen.

In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is generated in a gas that does not comprise nitrogen. For example in some embodiments a second reactant may comprise a plasma generated in a gas that does not comprise nitrogen. However, in some embodiments a gas that is used to form a plasma may comprise nitrogen. In some other embodiments the second reactant may comprise nitrogen radicals, nitrogen atoms and/or nitrogen plasma. In some embodiments the second reactant may be generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments the second reactant may be generated in a gas comprising hydrogen and nitrogen, for example the second reactant may comprise $H_2$ and $N_2$. In some embodiments the second reactant may be generated in a gas having a ratio of $N_2$ to $H_2$ ($N_2/H_2$) of less than about 20%, less than about 10%, or less than about 5%.

In some embodiments a gas that is used to form a plasma does not comprise nitrogen or oxygen. In some embodiments the adsorbed silicon precursor is not contacted with a reactive species generated by a plasma from a gas comprising nitrogen or oxygen. In some embodiments a second reactant comprising reactive species is generated in a gas that does not comprise nitrogen or oxygen. For example in some embodiments a second reactant may comprise a plasma generated in a gas that does not comprise nitrogen or oxygen.

In some embodiments excess second reactant and any reaction byproducts are removed from the proximity of the substrate surface. The second reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber Additional phases may be added and phases may be removed as desired to adjust the composition of the final film.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may contact the substrate simultaneously in phases that partially or completely overlap. In addition, although referred to as the first and second phases, and the first and second reactants, the order of the phases may be varied, and an ALD cycle may begin with any one of the phases. That is, unless specified otherwise, the reactants can contact the substrate in any order, and the process may begin with any of the reactants.

As discussed in more detail below, in some embodiments for depositing a SiOC film, one or more deposition cycles begin by contacting the substrate with the silicon precursor, followed by the second precursor. In other embodiments deposition may begin by contacting the substrate with the second precursor, followed by the silicon precursor.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas does not comprise nitrogen. In some embodiments the gas may comprise noble gas, such as helium or argon. In some embodiments the gas is helium. In some embodiments the gas is argon. The flowing gas may also serve as a purge gas for the first and/or second reactant (or reactive species). For example, flowing argon may serve as a purge gas for a first silicon precursor and also serve as a second reactant (as a source of reactive species). In some embodiments, argon or helium may serve as a purge gas for a first precursor and a source of excited species for converting the silicon precursor to the SiOC film. In some embodiments the gas in which the plasma is generated does not comprise nitrogen and the adsorbed silicon precursor is not contacted with a reactive species generated by a plasma from nitrogen. In some embodiments the gas in which the plasma is generated does not comprise oxygen and the adsorbed silicon precursor is not contacted with a reactive species generated by a plasma from oxygen. In some embodiments the gas in which the plasma is generated does not comprise oxygen or nitrogen and the adsorbed silicon precursor is not contacted with a reactive species generated by a plasma from oxygen or nitrogen.

The cycle is repeated until a film of the desired thickness and composition is obtained. In some embodiments the deposition parameters, such as the precursor flow rate, contacting time, removal time, and/or reactants themselves, may be varied in one or more deposition cycles during the ALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with the silicon reactant first. After an initial surface termination, if necessary or desired, the substrate is contacted with a first silicon reactant. In some embodiments a first silicon reactant pulse is supplied to the workpiece. In accordance with some embodiments, the first reactant pulse comprises a carrier gas flow and a volatile silicon species, such as silicon alkoxide compounds, for example BTESE or MPTMS, that is reactive with the workpiece surfaces of interest. Accordingly, the silicon reactant adsorbs upon these workpiece surfaces. The first reactant pulse self-saturates the workpiece surfaces with silicon reactant species such that any excess constituents of the first reactant pulse do not further react with the molecular layer formed by this process.

The first silicon reactant pulse can be supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer to adsorb on the substrate surface, excess first silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or purge gas for a sufficient time to diffuse or purge excess reactants and reactant by-products, if any, from the reaction space. In some embodiments the excess first precursor is purged with the aid of inert gas, such as helium or argon, which is flowing throughout the ALD cycle. In some embodiments the substrate may be moved from the reaction space containing the first reactant to a second, different reaction space. In some embodiments, the first reactant is removed for about 0.1 seconds to about 10 seconds, about 0.3 seconds to about 5 seconds or about 0.3 seconds to about 1 second. Contacting and removal of the silicon reactant can be considered the first or silicon phase of the ALD cycle.

In the second phase, a second reactant comprising a reactive species, such as hydrogen plasma and/or an oxygen-free plasma is provided to the workpiece. Hydrogen plasma may be formed by generating a plasma in hydrogen in the reaction chamber or upstream of the reaction chamber, for example by flowing the hydrogen ($H_2$) through a remote plasma generator.

In some embodiments, plasma is generated in flowing $H_2$ gas. In some embodiments $H_2$ is provided to the reaction chamber before the plasma is ignited or hydrogen atoms or radicals are formed. In some embodiments the $H_2$ is provided to the reaction chamber continuously and hydrogen containing plasma, atoms or radicals is created or supplied when needed.

Typically, the second reactant, for example comprising hydrogen plasma, contacts the substrate for about 0.1 seconds to about 10 seconds. In some embodiments the second reactant, such as hydrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen containing plasma, is provided in two or more sequential pulses, without introducing a Si-precursor in between the sequential pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments plasma, for example hydrogen containing plasma may be generated by applying RF power of from about 5 W to about 5000 W, 10 W to about 2000 W, from about 50 W to about 1000 W, or from about 200 W to about 800 W in some embodiments. In some embodiments the RF power density may be from about 0.001 W/cm$^2$ to about 10 W/cm$^2$, from about 0.01 W/cm$^2$ to about 5 W/cm$^2$, from about 0.02 W/cm$^2$ to about 2.0 W/cm$^2$, or from about 0.05 W/cm$^2$ to about 1.5 W/cm$^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.05 cm to about 50 cm, from about 0.1 cm to about 20 cm, from about 0.5 cm to about 5 cm, or from about 0.8 cm to about 3.0 cm. As described herein, in some embodiments the plasma power may be selected, for example from a given range of plasma powers, in order to achieve a desired step coverage, etch rate, or WERR, for a deposited film.

After a time period sufficient to completely saturate and react the previously adsorbed molecular layer of silicon species with the plasma pulse, any excess reactant and reaction byproducts are removed from the substrate surface.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant by-products, if any, from the reaction space. In some embodiments the excess second precursor is purged with the aid of inert gas, such as helium or argon, which is flowing throughout the ALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in a SiOC atomic layer deposition cycle.

The two phases together represent one ALD cycle, which is repeated to form SiOC thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., from about 50° C. to about 600° C., from about 100° C. to about 450° C., or from about 200° C. to about 400° C. In some embodiments, the optimum reactor temperature may be limited by the maximum allowed thermal budget. Therefore, in some embodiments the reaction temperature is from about 100° C. to about 300° C. In some applications, the maximum temperature is about 200° C., and, therefore the PEALD process is run at that reaction temperature.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized by exposure to an oxygen plasma process, but not by a PEALD process as described herein.

In some embodiments a substrate used in the PEALD processes described herein may comprise an organic material. For example, the substrate may comprise an organic material such as a plastic, polymer, and/or photoresist. In some embodiments where the substrate comprises an organic material the reaction temperature of a PEALD process may be less than about 200° C. In some embodiments the reaction temperature may be less than about 150° C., less than about 100° C., less than about 75° C., or less than about 50° C.

In some embodiments where a substrate comprises an organic material the maximum process temperature may be as low as 100° C. In some embodiments where the substrate comprises an organic material, the absence of a plasma generated from oxygen may allow for deposition of a SiOC thin film on an organic material that may not otherwise degrade in a deposition process including plasma generated from oxygen.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOC deposition process can be performed at a pressure of about 20 Torr to about 500 Torr, about 20 Torr to about 50 Torr, or about 20 Torr to about 30 Torr.

In some embodiments a SiOC deposition process can comprise a plurality of deposition cycles, wherein at least one deposition cycle is performed in an elevated pressure regime. For example, a deposition cycle of a PEALD process may comprise alternately and sequentially contacting the substrate with a silicon precursor and a second reactant under the elevated pressure. In some embodiments, one or more deposition cycles of the PEALD process can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

Controlled Formation of SiOC Films

As mentioned above, and discussed in more detail below, in some embodiments SiOC thin films can be deposited on a substrate in a reaction space by a plasma enhanced atomic deposition layer (PEALD) process. According to some embodiments, a SiOC thin film is deposited using a PEALD process on a substrate having three dimensional features, such as in a FinFET application. In some embodiments where a SiOC thin film is deposited on a three dimensional feature, properties such as the step coverage and/or WERR of the deposited film on different surfaces of the feature may be controlled by selecting an appropriate plasma power from a given range or plasma powers. In some embodiments the properties of the deposited film, such as the thickness or WER, may be controlled to be different on different surfaces, such as vertical and horizontal surfaces of the feature. In some embodiments a PEALD process as described herein may be used in a variety of applications. For example, a PEALD process as described herein may be used in the formation of hardmask layers, sacrificial layers, protective layers, or low-k spacers. A PEALD process as described herein may be used in, for example, memory device applications.

In some embodiments a SiOC thin film may be deposited by a PEALD process that does not include oxygen plasma, as described herein, on a substrate that is not able to withstand O plasma without damage, for example a substrate comprising an organic and/or photoresist material.

Referring to FIG. 1A and according to some embodiments the formation of a SiOC thin film on a substrate comprising a three dimensional feature in a reaction space is controlled by a PEALD deposition process 100 comprising at least one cycle comprising:

contacting the substrate with a vapor phase silicon-containing precursor that comprises oxygen at step 120 such that silicon species adsorb onto the surface of the substrate;

removing excess silicon-containing precursor and reaction byproducts, if any, from the substrate surface at step 130;

selecting a plasma power from a range of plasma powers to achieve a desired step coverage and/or WERR for the to be deposited SiOC film at step 140;

contacting the substrate with a second reactant comprising reactive species comprising hydrogen and not comprising oxygen generated by plasma generated at the selected plasma power at step 150 in a gas that does not comprise oxygen, thereby converting the adsorbed silicon species into SiOC;

removing excess second reactant and reaction byproducts, if any, from the substrate surface at step 160; and optionally repeating the contacting and removing steps at step 170 to form a SiOC thin film of a desired thickness, composition, step coverage, and/or WERR on a three dimensional feature of the substrate.

In some embodiments step 140 may comprise selecting an appropriate plasma power to achieve a desired step coverage and/or WERR from a range of plasma powers, for example a range of from about 50 W to about 1000 W for a three dimensional feature having an aspect ratio of from about 1 to about 3. In some embodiments the plasma power required to achieve a desired property may be worked out prior to the deposition process. That is, in some embodiments the range of plasma powers corresponds to a known range of pre-established material properties for the to be deposited film. In some embodiments the aspect ratio of the three dimensional feature may influence the selected plasma power. For example, a higher plasma power may be selected to achieve a desired step coverage on a three dimensional feature having a high aspect ratio than on a three dimensional feature having a comparatively lower aspect ratio. In some embodiments a higher, or greater, plasma power may be selected to achieve a SiOC film having a higher desired step coverage on a given three-dimensional structure. In some embodiments a higher plasma power may be selected to achieve a SiOC film having a lower WERR than a substantially similar film deposited by a substantially similar deposition process using a lower plasma power. As used herein, the wet etch rate ratio (WERR) refers to the ratio of the wet etch rate of material deposited on a vertical surface, such as a sidewall to the wet etch rate of material deposited on a horizontal surface, such as a top surface of a three dimensional feature.

In some embodiments selecting an appropriate plasma power can achieve a desired step coverage below, at, or about 100% using the same combination of precursors and/or reactants. In some embodiments the plasma power can be selected such that the deposition process is selective on a first surface, such as a vertical surface of a three dimensional feature relative to a second surface, such as a horizontal surface of a three dimensional feature.

In some embodiments step 150 may comprise remotely generating or forming plasma or reactive species before contacting the substrate with the second reactant.

According to some embodiments the formation of a SiOC thin film on a substrate comprising a three dimensional feature in a reaction space is controlled by an ALD-type deposition process comprising multiple SiOC deposition cycles, each SiOC deposition cycle comprising:

contacting a substrate with a vapor phase silicon reactant that comprises oxygen such that a silicon compound adsorbs on the substrate surface;

exposing the substrate to a purge gas and/or vacuum;

selecting a plasma power from a range of plasma powers to achieve a desired step coverage and/or WERR for the to be deposited SiOC film;

contacting the substrate with reactive species generated by forming a plasma generated at the selected plasma power in a gas comprising hydrogen; and exposing the substrate to a purge gas and/or vacuum;

optionally repeating the contacting and exposing steps until a SiOC thin film of a desired thickness, composition, step coverage, and/or WERR is obtained.

In some embodiments the exposing the substrate to a purge gas and/or vacuum steps may comprise continuing the flow of an inert carrier gas while stopping the flow of a precursor or reactant. In some embodiments the exposing the substrate to a purge gas and/or vacuum steps may comprise stopping the flow of a precursor and a carrier gas into a reaction chamber and evacuating the reaction chamber, for example with a vacuum pump. In some embodiments the exposing the substrate to a purge gas and/or vacuum steps may comprise moving the substrate from a first reaction chamber to a second, different reaction chamber containing a purge gas. In some embodiments the exposing the substrate to a purge gas and/or vacuum steps may comprise moving the substrate from a first reaction chamber to a second, different reaction chamber under a vacuum. In some embodiments the reactive species may not comprise nitrogen.

In some embodiments selecting an appropriate plasma power to achieve a desired step coverage and/or WERR from a range of plasma powers may comprise, for example selecting a plasma power from a range of from about 50 W to about 1000 W for a three dimensional feature having an aspect ratio of from about 1 to about 3. In some embodiments the aspect ratio of the three dimensional feature may influence the selected plasma power. For example, a three dimensional feature having a high aspect ratio may require selecting a higher plasma power to achieve a desired step coverage than a three dimensional feature having a comparatively lower aspect ratio. In some embodiments a higher, or greater, plasma power may be selected to achieve a SiOC film having a higher desired step coverage. In some embodiments a higher plasma power may be selected to achieve a SiOC film having a lower WERR. In some embodiments the plasma power may be selected from a range of about 200 W to about 650 W, or from about 200 W to about 500 W. In some embodiments the plasma power may be selected from a range of about 650 W or less, 500 W or less, or 200 W or less.

In some embodiments the formation of a SiOC thin film on a substrate comprising a three dimensional feature in a reaction space is controlled by a PEALD deposition process comprising at least one cycle comprising:

contacting the substrate with a vapor phase silicon-containing precursor comprising MPTMS such that silicon species adsorb onto the surface of the substrate;

removing excess silicon-containing precursor and reaction byproducts, if any, from the substrate surface;

selecting a plasma power from a range of plasma powers to achieve a desired step coverage and/or WERR for the to be deposited SiOC film;

contacting the substrate with a second reactant comprising reactive species generated by plasma from a gas comprising H₂ and Ar, the plasma generated by the selected plasma power, thereby converting the adsorbed silicon species into SiOC;

removing excess second reactant and reaction byproducts, if any, from the substrate surface; and optionally repeating the contacting and removing steps to form a SiOC thin film of a desired thickness, composition, step coverage, and/or WERR on a three dimensional feature of the substrate.

In certain embodiments, a SiOC thin film is formed on a substrate by an ALD-type process comprising multiple SiOC deposition cycles, each SiOC deposition cycle comprising: alternately and sequentially contacting the substrate with a first vapor phase silicon precursor that comprises oxygen and a second reactant comprising reactive species generated by forming a plasma in a gas with a selected plasma power. In some embodiments the plasma power may be selected from a range of plasma powers in order to achieve a desired step coverage and/or WERR in the to be deposited SiOC film.

In some embodiments, the PEALD process is performed at a temperature between about 100° C. to about 650° C., about 100° C. to about 550° C., about 100° C. to about 450° C., about 200° C. to about 600° C., or at about 200° C. to about 400° C. In some embodiments the temperature is about 300° C. In some embodiments the temperature is about 200° C. In some embodiments, for example where a substrate comprises an organic material such as an organic photoresist, the PEALD process may be performed at a temperature less than about 100° C. In some embodiments the PEALD process is performed at a temperature less than about 75° C., or less than about 50° C.

In some embodiments a plasma may be generated by applying the selected plasma power, for example a selected RF power to a gas. The RF power may be applied to to thereby generate reactive species. In some embodiments the RF power may be applied to the a gas that flows continuously through the reaction chamber, and/or that flows through a remote plasma generator. Thus in some embodiments the plasma is generated in situ, while in other embodiments the plasma is generated remotely. In some embodiments the selected RF power applied is selected from a range of from about 5 W to about 5000 W, from about 10 W to about 2000 W, from about 50 W to about 1000 W or from about 200 W to about 800 W.

Referring to FIG. 1B and according to some embodiments the formation of a an oxygen-containing thin film on a substrate comprising a three dimensional feature in a reaction space is controlled by a PEALD deposition process 101 comprising at least one cycle comprising:

contacting the substrate with a vapor phase first precursor that comprises oxygen at step 121 such that precursor species adsorb onto the surface of the substrate;

removing excess first precursor and reaction byproducts, if any, from the substrate surface at step 131;

selecting a plasma power from a range of plasma powers to achieve a desired step coverage and/or WERR for the to be deposited thin film at step 141;

contacting the substrate with a second reactant comprising reactive species comprising hydrogen and not comprising oxygen generated by plasma generated at the selected plasma power at step 151, thereby converting the adsorbed silicon species into the oxygen-containing thin film;

removing excess second reactant and reaction byproducts, if any, from the substrate surface at step 161; and optionally repeating the contacting and removing steps at step 171 to form an oxygen-containing thin film of a desired thickness, composition, step coverage, and/or WERR on a three dimensional feature of the substrate.

In some embodiments step 141 may comprise selecting an appropriate plasma power to achieve a desired step coverage and/or WERR from a range of plasma powers, for example a range of from about 50 W to about 1000 W for a three dimensional feature having an aspect ratio of from about 1 to about 3. In some embodiments the plasma power required to achieve a desired property may be worked out prior to the deposition process. That is, in some embodiments the range of plasma powers corresponds to a known range of pre-established material properties for the to be deposited film. In some embodiments the aspect ratio of the three dimensional feature may influence the selected plasma power. For example, a higher plasma power may be selected to achieve a desired step coverage on a three dimensional feature having a high aspect ratio than on a three dimensional feature having a comparatively lower aspect ratio. In some embodiments a higher, or greater, plasma power may be selected to achieve a film having a higher desired step coverage on a given three-dimensional structure. In some embodiments a higher plasma power may be selected to achieve a film having a lower WERR than a substantially similar film deposited by a substantially similar deposition process using a lower plasma power. As used herein, the wet etch rate ratio (WERR) refers to the ratio of the wet etch rate of material deposited on a vertical surface, such as a sidewall to the wet etch rate of material deposited on a horizontal surface, such as a top surface of a three dimensional feature.

In some embodiments selecting an appropriate plasma power can achieve a desired step coverage below, at, or about 100% using the same combination of precursors and/or reactants. In some embodiments the plasma power can be selected such that the deposition process is selective on a first surface, such as a vertical surface of a three dimensional feature relative to a second surface, such as a horizontal surface of a three dimensional feature.

In some embodiments step 151 may comprise remotely generating or forming plasma or reactive species before contacting the substrate with the second reactant.

Figure 2:
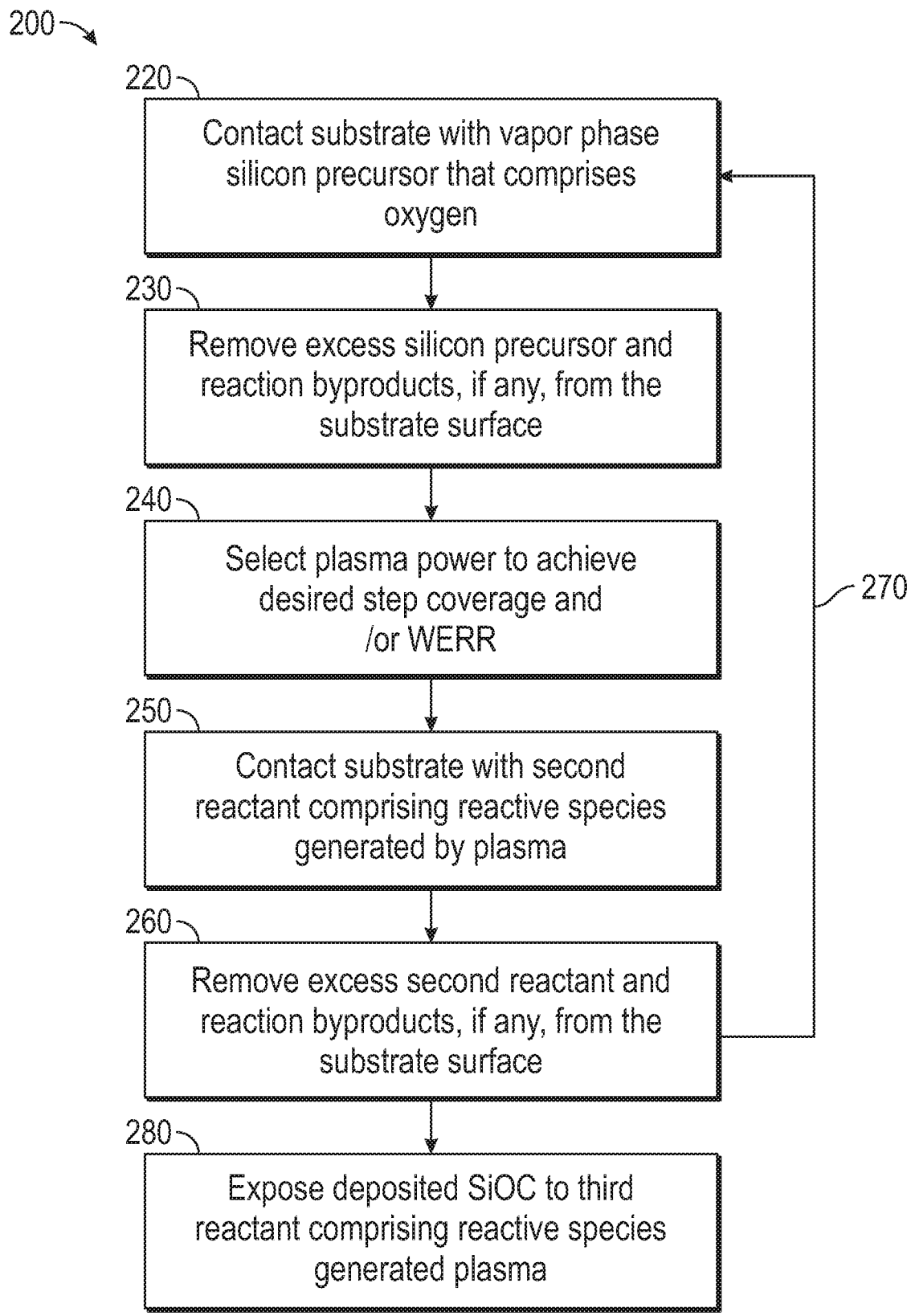
FIG. 2 is a process flow diagram for the controlled formation of a SiOC thin film by a PEALD process according to some embodiments.

Referring to FIG. 2 and according to some embodiments the formation of a SiOC thin film on a substrate comprising a three dimensional feature in a reaction space is controlled by a PEALD deposition process 200 comprising:

contacting the substrate with a vapor phase silicon-containing precursor that comprises oxygen at step 220 such that silicon species adsorb onto the surface of the substrate;

removing excess silicon-containing precursor and reaction byproducts, if any, from the substrate surface at step 230;

selecting a plasma power from a range of plasma powers to achieve a desired step coverage and/or WERR for the to be deposited SiOC film at step 240;

contacting the substrate with a second reactant comprising reactive species comprising hydrogen and not comprising oxygen generated by plasma generated by the selected plasma power at step 250 in a gas that does not comprise oxygen, thereby converting the adsorbed silicon species into SiOC;

removing excess second reactant and reaction byproducts, if any, from the substrate surface at step 260;

optionally repeating the contacting and removing steps at step 270 to form a SiOC thin film of a desired thickness, composition, step coverage, and/or WERR on a three dimensional feature of the substrate; and exposing the deposited SiOC film to a third reactant comprising reactive species generate by plasma from a gas at step 280 to thereby reduce the thickness and/or WERR of the deposited SiOC film.

In some embodiments step 240 may comprise selecting an appropriate plasma power to achieve a desired step coverage and/or WERR from a range of plasma powers, for example a range of from about 50 W to about 1000 W for a three dimensional feature having an aspect ratio of from about 1 to about 3. In some embodiments the aspect ratio of the three dimensional feature may influence the selected plasma power. For example, a three dimensional feature having a high aspect ratio may require selecting a higher plasma power to achieve a desired step coverage than a three dimensional feature having a comparatively lower aspect ratio. In some embodiments a higher, or greater, plasma power may be selected to achieve a SiOC film having a higher desired step coverage. In some embodiments a higher plasma power may be selected to achieve a SiOC film having a lower WERR.

In some embodiments step 250 may comprise remotely generating or forming plasma or reactive species before contacting the substrate with the second reactant.

In some embodiments step 280 comprises a post deposition treatment and may comprise remotely generating or forming plasma or reactive species before contacting the substrate with the third reactant. In some embodiments the third reactant may comprise identical reactive species to the second reactant. In some embodiments the gas used to generate the reactive species comprising the third reactant may comprise hydrogen, nitrogen or oxygen. In some embodiments the gas used to generate the reactive species comprising the third reactant may comprise a noble gas or gases, such as argon. In some embodiments the third reactant may be substantially the same as the second reactant, but the plasma power used to generate the third reactant may be different than the plasma power used to generate the second reactant. For example, in some embodiments a higher plasma power may be used to generate the reactive species comprising the third reactant than is used to generate the reactive species comprising the second reactant. For example, in some embodiments a plasma power of about 10 W to about 1000 W, about 400 W to about 600 W, from about 400 W to about 1000 W, from about 300 W to about 500 W or from about 600 W to about 1000 W may be used to generate the reactive species of the third reactant.

In some embodiments exposing the deposited SiOC film to a third reactant may reduce the thickness and/or WERR of the deposited SiOC film. In some embodiments step 280 may reduce the thickness and/or WER of a first portion of the SiOC film more than a second portion of the SiOC film. For example, in some embodiments step 280 may reduce the thickness of the SiOC film on a first surface, such as a vertical surface of the substrate, and a second surface, such as a horizontal surface of the substrate such that the thickness of the SiOC film deposited on the second surface is reduced substantially more than the thickness of the SiOC film deposited on the first surface. That is, in some embodiments the post deposition treatment of step 280 may increase the step coverage of the SiOC film. In some embodiments the post deposition treatment of step 280 may increase the step coverage of the SiOC film by about 10%, 25%, 50%, 75%, 100%, 200%, 500%, or 1000% or more.

In some embodiments step 280 may reduce the WER of the SiOC film on a first surface, such as a vertical surface of the substrate, and a second surface, such as a horizontal surface of the substrate such that the WER of the SiOC film on the first surface is reduced substantially more than the WER of the SiOC film on the second surface. That is, in some embodiments the post deposition treatment comprising step 280 may reduce the WERR of the SiOC film. For example, in some embodiments a post deposition treatment comprising step 280 may reduce the WERR of the SiOC film by about 5%, 10%, 25%, 50%, 75%, 90%, or even 100%, As mentioned above, in some embodiments step 280 may be provided at intervals during the deposition process. That is, the entire deposition process 200 may be repeated multiple times. In some embodiments the deposition cycle 220-260 may be repeated 270 two or more times, a treatment step 280 provided and then the deposition cycle 220-260 repeated again (270) one or more times, followed by a further treatment step. This process can be repeated multiple times to produce the desired SiOC film. The cyclic process can be described as X×(Y×270+280), where X and Y are integers, and can be the same or different.

Figure 3:
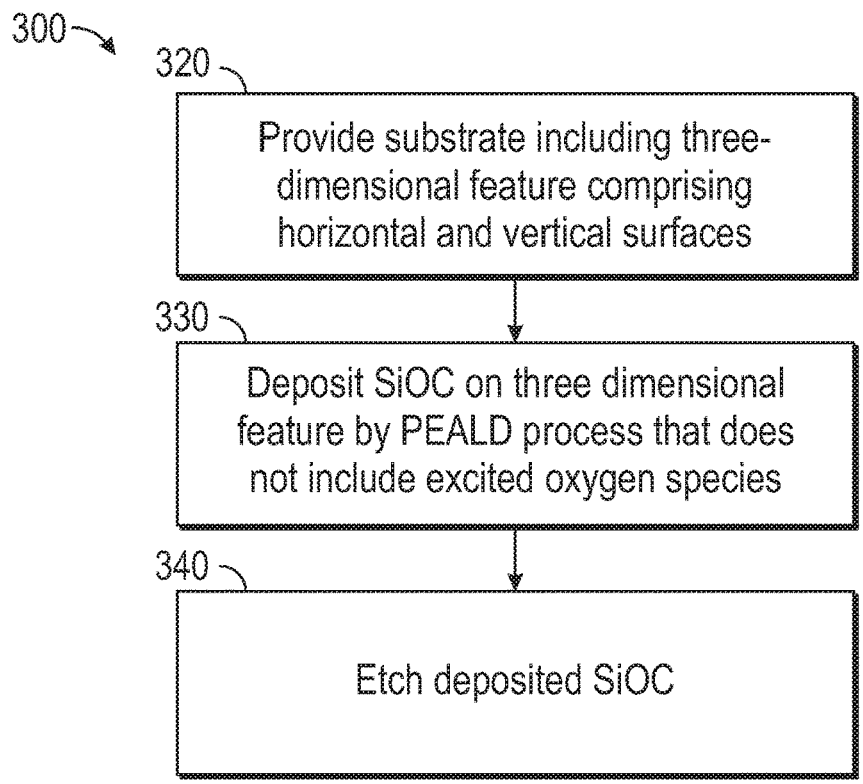
FIG. 3 is a process flow diagram for the selective formation of a SiOC thin film on horizontal surfaces of a three dimensional feature relative to vertical surfaces of the same three dimensional feature by a PEALD process.

Referring now to FIG. 3 and according to some embodiments the formation of a SiOC thin film on a three dimensional feature is controlled by a process 300 comprising:

providing a substrate comprising at least one three dimensional feature comprising a horizontal surface and a vertical surface at step 320;

depositing SiOC on the at least one three dimensional feature by a PEALD process that does not comprise excited oxygen species, as described herein at step 330; and etching the deposited SiOC at step 340.

In some embodiments depositing SiOC on the at least one three dimensional feature at step 330 may comprise depositing SiOC by the deposition processes provided herein, for example the controlled formation PEALD processes described above with respect to FIGS. 1 and 2.

In some embodiments etching the deposited SiOC at step 340 may comprise an etch process known in the art, for example a dry etch process such as a plasma etch process or a wet etch process such as a 0.5 wt % dilute HF etch process. In some embodiments etching the deposited SiOC at step 340 may remove at least a portion of the deposited SiOC.

In some embodiments the etch process may comprise exposing the substrate to hydrogen atoms, hydrogen radicals, hydrogen plasma, or combinations thereof. For example, in some embodiments the etch process may comprise exposing the substrate to a plasma generated from $H_2$ using a power from about 10 W to about 5000 W, from about 25 W to about 2500 W, from about 50 W to about 500 W, or from about 100 W to about 400 W. In some embodiments the etch process may comprise exposing the substrate to a plasma generated using a power from about 1 W to about 1000 W, from about 10 W to about 500 W, from about 20 W to about 250 W, or from about 25 W to about 100 W.

In some embodiments the etch process may comprise exposing the substrate to a plasma. In some embodiments the plasma may comprise reactive species such as oxygen atoms, oxygen radicals, oxygen plasma, or combinations thereof. In some embodiments the plasma may comprise reactive species such as hydrogen atoms, hydrogen radicals, hydrogen plasma, or combinations thereof. In some embodiments the plasma may also comprise noble gas species in addition to reactive species, for example Ar or He species. In some embodiments the plasma may comprise noble gas species without reactive species. In some instances, the plasma may comprise other species, for example nitrogen atoms, nitrogen radicals, nitrogen plasma, or combinations thereof. In some embodiments the substrate may be exposed to an etchant at a temperature of between about 30° C. and about 500° C., or between about 100° C. and about 400° C.

In some embodiments the etchant may be supplied in one continuous pulse or may be supplied in multiple shorter pulses.

A skilled artisan can readily determine the optimal exposure time, temperature, and/or power for removing the desired amount of deposited SiOC from the three dimensional feature.

In some embodiments etching the deposited SiOC at step 340 may remove substantially all of the deposited SiOC from a first surface, such as a vertical surface of the three dimensional feature and may not remove substantially all of the deposited SiOC from a second different surface, such as a horizontal surface of the three dimensional feature. In this way, the selective formation of SiOC on a desired surface of the three dimensional feature can be controlled. For example, in some embodiments, due to the controlled formation of the SiOC film by the deposition process of step 330, the amount of SiOC deposited on a vertical surface of the three dimensional feature may be substantially less than the amount of SiOC deposited on a horizontal surface. Accordingly, in some embodiments the difference in deposited film thicknesses on two surfaces may allow for differential etching such that substantially all of the film may be removed from one surface while some film or material remains on a second, different surface.

In some embodiments due to the controlled formation of the SiOC film by the deposition process of step 330, the WER of SiOC deposited on a vertical surface of the three dimensional feature may be substantially higher than the WER of SiOC deposited on a horizontal surface. Therefore, an etch process may essentially completely remove deposited SiOC from a vertical surface of the three dimensional feature while deposited SiOC may remain on a horizontal surface of the three dimensional feature.

As discussed in more detail below, in some embodiments for depositing a SiOC film, one or more PEALD deposition cycles begin with provision of the silicon precursor, followed by the second reactant. In other embodiments deposition may begin with provision of the second reactant, followed by the silicon precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a SiOC thin film.

Si Precursors

A number of different suitable Si precursors can be used in the presently disclosed PEALD processes. In some embodiments a suitable Si precursor may comprise a silane.

In some embodiments a suitable Si precursor may comprise two Si atoms connected by, or bonded to, at least one hydrocarbon group. In some embodiments a suitable Si precursor may comprise two Si atoms connected by, or bonded to, at least one alkyl group. In some embodiments a suitable Si precursor may comprise two Si atoms connected by, or bonded to, at least one alkoxy group. In some embodiments a suitable Si precursor may comprise two Si atoms connected by, or bonded to, at least one silyl group. In some embodiments a suitable Si precursor may comprise two Si atoms connected by, or bonded to, at least one silyl ether group. In some embodiments a suitable Si precursor may comprise at least one —SH group, wherein the —SH may be bonded to an alkyl chain or a silicon atom. In some embodiments a suitable Si precursor may comprise at least one mercapto group. In some embodiments a suitable Si precursor may comprise at least one —R—SH structure, wherein R may be a $C_1$-$C_5$ alkyl group. In some embodiments a suitable Si precursor may comprise at least one —SH group on an alkyl chain and one or more alkoxy groups bonded to a silicon atom.

In some embodiments a suitable Si precursor may comprise at least one Si atom attached or bonded to one or more alkoxy groups. In some embodiments a suitable Si precursor may comprise at least one Si atom attached or bonded to one or more alkyl groups. In some embodiments a suitable Si precursor may comprise at least one Si atom attached or bonded to at least an alkyl group and an alkoxy group.

In some embodiments, at least some Si precursors suitable for deposition of SiOC by PEALD processes may comprise bridged alkoxysilanes having the following general formula:

$$(R^{II}O)_3Si\text{—}R^I\text{—}Si(OR)_3 \qquad (1)$$

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise bridged alkoxyalkylsilanes having the following general formula:

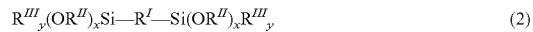
$$R^{III}_y(OR^{II})_xSi\text{—}R^I\text{—}Si(OR^{II})_xR^{III}_y \qquad (2)$$

Wherein each of $R^I$, $R^{II}$, and $R^{III}$ may be independently selected alkyl groups, and x+y=3. In some embodiments each of R and R are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise cyclic alkoxysilanes having the following general formula:

$$(R^{II}O)_2Si\text{—}R^{II}_2\text{—}Si(OR^{II})_2 \qquad (3)$$

Formula (3) may alternately be represented by the structural formula:

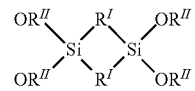

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise cyclic alkoxyalkylsilanes having the following general formula:

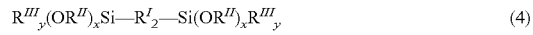
$$R^{III}_y(OR^{II})_xSi\text{—}R^I_2\text{—}Si(OR^{II})_xR^{III}_y \qquad (4)$$

Formula (4) may alternately be represented by the structural formula:

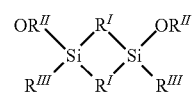

Wherein each of $R^I$, $R^{II}$, and $R^{III}$ may be independently selected alkyl groups, and x+y=2. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise linear alkoxysilanes having the following general formula:

$$(R^{II}O)_3Si-(O-Si-R^I_2)_n-O-Si(OR^{II})_3 \quad (5)$$

Wherein $R^I$ may be an independently selected alkyl group or hydrogen, $R^{II}$ may be an independently selected alkyl group, and n=1-4. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^I$ may be hydrogen and $R^{II}$ may be an independently selected $C_1$-$C_5$ alkyl ligand.

According to some embodiments, some Si precursors may comprise linear alkoxysilanes having the following general formula:

$$R^{III}_y(OR^{II})_xSi-(-R^I-Si)_n-Si(OR^{II})_xR^{III}_y \quad (6)$$

Wherein each of $R^I$, $R^{II}$, and $R^{III}$ may be independently selected alkyl groups, x+y=2, and n can be greater than or equal to 1. In some embodiments $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise alkoxysilanes having the following general formula:

$$Si(OR^I)_4 \quad (7)$$

Wherein $R^I$ may be an independently selected alkyl group. In some embodiments $R^I$ may be an independently selected $C_1$-$C_5$ alkyl ligand, such as methyl, ethyl, n-propyl, isopropyl, tertbutyl, or pentyl.

According to some embodiments, some Si precursors may comprise alkoxyalkylsilanes having the following general formula:

$$Si(OR^I)_{4-x}R^{II}_x \quad (8)$$

Wherein each of $R^I$ and $R^{II}$ may be independently selected alkyl groups, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may be an independently selected $C_1$-$C_5$ alkyl ligand.

According to some embodiments, some Si precursors may comprise alkoxysilanes that do not comprise nitrogen and have the following general formula:

$$Si(OR^I)_{4-x}R^{II}_x \quad (9)$$

Wherein $R^I$ may be an independently selected alkyl group, $R^{II}$ may be any ligand comprising carbon, hydrogen, and/or oxygen that does not comprise nitrogen, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may comprise, for example an alkenyl, alkynyl, phenyl, carbonyl, aldehyde, ester, ether, carboxyl, peroxy, hydroperoxy, thiol, acrylate, or methacrylate ligand.

According to some embodiments, some Si precursors may the following general formula:

$$Si(OR^I)_{4-x}R^{II}_x \quad (10)$$

Wherein x=0-3, $R^I$ may be an independently selected $C_1$-$C_7$ or $C_1$-$C_5$ alkyl ligand, and $R^{II}$ may be an independently selected ligand consisting of carbon, and/or hydrogen, and/or oxygen. For example, in some embodiments $R^{II}$ can be an alkoxyalkyl group. In some embodiments $R^{II}$ can be, for example, an alkenyl, alkynyl, phenyl, carbonyl, aldehyde, ester, ether, carboxyl, peroxy, or hydroperoxy group. In some embodiments, for example, $R^I$ is a methyl group, $R^{II}$ is a 3-methoxypropyl ligand, and x is 1.

According to some embodiments, some Si precursors may have the following general formula:

$$(R^IO)_{4-x}Si-(R^{II}-O-R^{III})_x \quad (11)$$

Wherein x=0-3, each of $R^I$ and $R^{II}$ may be an independently selected $C_1$-$C_7$ or $C_1$-$C_5$ alkyl ligand, and $R^I$ may be an independently selected ligand consisting of carbon, and/or hydrogen, and/or oxygen. For example, in some embodiments $R^{III}$ can be, for example, an alkenyl, alkynyl, phenyl, carbonyl, aldehyde, ester, ether, carboxyl, peroxy, or hydroperoxy group. In some embodiments, for example, $R^I$, $R^{II}$, and $R^{III}$ can each be a group independently selected from methyl, ethyl, i-propyl, n-propyl, n-butyl, i-butyl, and t-butyl.

According to some embodiments, some Si precursors may have the following general formula:

$$Si(R^I)_{4-x-y}R^{II}_xR^{III}_y \quad (12)$$

Wherein x+y=0-4, $R^I$ is an alkoxide ligand having from 1 to 5 carbon atoms, or a halide, $R^{II}$ is any ligand comprising sulfur, and $R^{III}$ consists of one of a sulfhydryl, sulfide, disulfide, sulfinyl, sulfonyl, sulfino, sulfo, thiocyanate, isothiocyanate, or carbonothioyl functionality. In some embodiments $R^I$, $R^{II}$, and $R^{III}$ may each be independently selected. In some embodiments $R^I$ may comprise a methoxy ligand, $R^{II}$ may comprise 3-mercaptopropyl, x=1, and y=. That is, in some embodiments some an Si precursor may comprise $Si(OCH_3)_3C_3H_6SH$. In some embodiments a Si precursor may comprise mercaptomethylmethyldiethoxysilane, 3-mercaptopropylmethyldimethoxysilane and/or 3-mercaptopropyltriethoxysilane In some embodiments the silicon precursor does not comprise a halogen. In some embodiments the silicon precursor does not comprise nitrogen. In some embodiments the carbon chain may be unsaturated and contain double carbon-carbon bonds. In some other embodiments the carbon chain may contain other atoms than carbon and hydrogen. According to some embodiments suitable silicon precursors can include at least compounds having any of the general formulas (1) through (11). FIG. 2 illustrates exemplary molecular structures for suitable Si precursors according to formulas (1)-(11) described above. In some embodiments the silicon precursor can comprise bis(triethoxysilyl)ethane (BTESE). In some embodiments the silicon precursor can comprise 3-methoxypropyltrimethoxysilane (MPTMS or $Si(OCH_3)_3C_3H_6OCH_3$). In some embodiments the silicon precursor can comprise (3-mercaptopropyl)trimethoxysilane.

In some embodiments, at least some Si precursors suitable for deposition of SiOCN by PEALD processes have the following general formula:

$$Si(OR^I)_{4-x}(R^{II}NR^{III}R^{IV})_x \quad (13)$$

Wherein x=1-4, $R^I$ may be an independently selected alkyl group, $R^{II}$ may be an independently selected hydrocarbon group, and $R^I$ and $R^{IV}$ may be independently selected alkyl groups and/or hydrogens. In some embodiments $R^I$ and $R^{II}$ are $C_1$-$C_3$ alkyl ligands, such as methyl, ethyl, n-propyl, or isopropyl. In some embodiments $R^I$ may be a $C_1$-$C_4$ alkyl ligand, such as methyl, ethyl, n-propyl, isopropyl, or tertbutyl. In some embodiments $R^{II}$ is not a $C_3$ hydrocarbon. In some embodiments $R^{II}$ is a $C_1$-$C_2$ hydrocarbon or a $C_4$-$C_6$ hydrocarbon. In some embodiments $R^{II}$ may be an unsaturated hydrocarbon, such as a hydrocarbon containing one or more double bonds. In some embodiments $R^{II}$ may be an alkyl group where one of the hydrogens is removed. In some embodiments $R^{III}$ and $R^{IV}$ are hydrogen. In some embodiments $R^I$ is methyl, $R^{II}$ is n-propyl, $R^{III}$ is hydrogen, $R^{IV}$ is hydrogen, and x=1.

For example, an Si precursor may have the formula (written in a more detailed manner in order to show bonding): $(R^I-O-)_{4-x}Si(-R^{II}-NR^{III}R^{IV})x$, wherein x=1-4, $R^I$ may be an independently selected alkyl group, $R^{II}$ may be an independently selected hydrocarbon, and $R^{III}$ and $R^{IV}$ may be independently selected alkyl groups and/or hydrogens.

According to some embodiments, some Si precursors may have the following general formula:

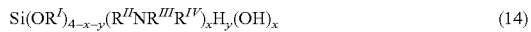

$$Si(OR^I)_{4-x-y}(R^{II}NR^{III}R^{IV})_x H_y(OH)_z \tag{14}$$

wherein x=1-4, y=0-3, and z=0-3, $R^I$ and $R^{II}$ may be an independently selected alkyl group, $R^{II}$ may be an independently selected hydrocarbon, and $R^{III}$ and $R^{IV}$ may be independently selected alkyl groups and/or hydrogens. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$L_n Si(OR^I)_{4-x-n}(R^{II}NR^{III}R^{IV}) \tag{15}$$

wherein n=1-3, x=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

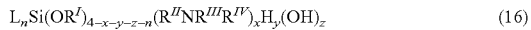

$$L_n Si(OR^I)_{4-x-y-z-n}(R^{II}NR^{III}R^{IV})_x H_y(OH)_z \tag{16}$$

wherein n=0-3 x=1-4, y=0-3, z=0-3, $R^I$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_{4-x}Si(R^{II}-NH_2)_x \tag{17}$$

wherein x=1-4, $R^I$ may be an independently selected alkyl group, and R may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^I$ is methyl, $R^{II}$ is n-propyl and x=1. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_3 Si-R^{II}-NH_2 \tag{18}$$

Wherein, $R^I$ may be an independently selected alkyl group, and $R^{II}$ may be an independently selected hydrocarbon. In some embodiments $R^I$ and $R^{II}$ are $C_1$-$C_3$ alkyl ligands, such as methyl, ethyl, n-propyl, or isopropyl. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_{4-x}Si(-[CH_2]_n-NH_2)_x \tag{19}$$

wherein x=1-4, n=1-5, and $R^I$ may be an independently selected alkyl group. In some embodiments $R^I$ is a $C_1$-$C_4$ alkyl ligand, such as methyl, ethyl, n-propyl, or isopropyl. In some embodiments $R^I$ is methyl, and x=1.

In some embodiments the silicon precursor does not comprise a halogen. In some embodiments the silicon precursor may comprise at least one aminoalkyl ligand. According to some embodiments a suitable silicon precursor may comprise at least one ligand which is bonded through carbon to silicon and contains at least one $NH_2$-group attached to a carbon chain, for example an aminoalkyl ligand. According to some embodiments a suitable silicon precursor may comprise at least one ligand which is bonded through carbon to silicon and contains an $NH_2$-group attached to a carbon chain, for example an aminoalkyl ligand, and may also comprise at least one ligand which is bonded to silicon through an oxygen atom and in which an alkyl group is bonded to oxygen, for example an alkoxide ligand. According to some embodiments a suitable silicon precursor may comprise at least one ligand which is bonded through carbon to silicon and contains at least one $NR^{III}R^{IV}$-group, wherein $R^{III}$ and $R^{IV}$ may be independently selected alkyl groups and/or hydrogens, attached to a carbon chain, for example an aminoalkyl ligand. According to some embodiments a suitable silicon precursor may comprise at least one ligand which is bonded through carbon to silicon and in which ligand at least one nitrogen is bonded to carbon. Further the one ligand which is bonded through carbon to silicon and in which ligand at least one nitrogen is bonded to carbon may comprise hydrogen bonded to nitrogen. According to some embodiments, in addition to a ligand which is bonded to silicon through carbon, a suitable silicon precursor may comprise also an alkoxy ligand, such as methoxy, ethoxy, n-propoxy, i-propoxy or tertbutoxy ligand. According to some embodiments, including some of the formulas of the above, a suitable silicon precursor comprises a carbon chain which is bonded to silicon through carbon, and in which there is an amino group, such as alkylamino or $-NH_2$ group, attached to the carbon chain and the carbon chain is a C1-C6 hydrocarbon, $C_2$-$C_6$ hydrocarbon or $C_2$-$C_4$ hydrocarbon, linear, branched or cyclic, containing only carbon and hydrogen. In some embodiments the carbon chain may be unsaturated and contain double carbon-carbon bonds. In some other embodiments the carbon chain may contain other atoms than carbon and hydrogen.

According to some embodiments suitable silicon precursors can include at least compounds having any of the general formulas (13) through (19). In some embodiments halides/halogens can include F, Cl, Br, and I. In some embodiments the silicon precursor can comprise (3-aminopropyl)trimethoxysilane (APTMS).

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOCN film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOC film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

Second Reactants

As discussed above, the second reactant for depositing SiOC according to the present disclosure may comprise an oxygen-free plasma. The plasma may be generated by applying plasma power to a gas that does not comprise oxygen. In some embodiments the second reactant may comprise a hydrogen precursor, which may comprise a reactive species. In some embodiments a reactive species includes, but is not limited to, radicals, plasmas, and/or excited atoms or species. Such reactive species may be generated by, for example, plasma discharge, hot-wire, or other suitable methods. In some embodiments the reactive species may be generated remotely from the reaction chamber, for example up-stream from the reaction chamber ("remote plasma"). In some embodiments the reactive species may be generated in the reaction chamber, in the direct vicinity of the substrate, or directly above the substrate ("direct plasma").

Suitable plasma compositions for the second reactant include hydrogen reactive species, that is, plasma, radicals of hydrogen, or atomic hydrogen in one form or another. In some embodiments a second reactant comprises reactive species generated by forming a plasma in a gas comprising hydrogen. In some embodiments the gas comprises hydrogen but not oxygen. In some embodiments a second reactant may comprise a reactive species formed at least in part from $H_2$. In some embodiments, a plasma may also contain noble gases, such as He, Ne, Ar, Kr and Xe, or Ar or He, in plasma form, as radicals, or in atomic form. In some embodiments the plasma is generated in a gas comprising $H_2$. In some embodiments the gas comprises $H_2$ and Ar.

In some embodiments the second reactant may comprise reactive species formed from $H_2$. In some embodiments the second reactant may be generated from a gas containing more than about 25 atomic % (at %) hydrogen, more than about 50 at % hydrogen, more than about 75 at % hydrogen, more than about 85 at % hydrogen, more than about 90 at % hydrogen, more than about 95 at % hydrogen, more than about 96 at %, 97 at %, 98 at %, or more than about 99 at % hydrogen.

In some embodiments the gas used to generate reactive species, such as plasma, may consist essentially of hydrogen. Thus, in some embodiments the second reactant may consist essentially of hydrogen plasma, radicals of hydrogen, or atomic hydrogen. In some embodiments the second reactant may comprise more than about 25 at % to hydrogen, more than about 50 at % hydrogen, 75 at %, more than about 85 at %, more than about 90 at %, more than about 95 at %, more than about 96 at %, 97 at %, 98 at %, or more than about 99 at % hydrogen plasma, radicals of hydrogen, or atomic hydrogen. In some embodiments the second reactant may be formed, at least in part, from $H_2$ and one or more other gases, where the $H_2$ and other gas or gases are provided at a flow ratio (112/other gas or gases), from about 1:1000 to about 1000:1 or greater. In some embodiments the flow ratio ($H_2$/other gas or gases) may be greater than about 1:1000, greater than about 1:100, greater than about 1:50, greater than about 1:20, greater than about 1:10, greater than about 1:6, greater than about 1:3, greater than about 1:1, greater than about 3:1, greater than about 6:1, greater than about 10:1, greater than about 20:1, 50:1, 100:1, or 1000:1 or greater.

In some embodiments, the second reactant does not comprise any species generated from oxygen. Thus, in some embodiments reactive species are not generated from a gas containing oxygen. In some embodiments a second reactant comprising reactive species is generated from a gas that does not contain oxygen. For example in some embodiments a second reactant may comprise a plasma generated from a gas that does not contain oxygen. In some other embodiments the second reactant may be generated from a gas containing less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen. In some embodiments a second reactant does not comprise $O_2$, $H_2O$ or $O_3$.

In some embodiments, a hydrogen plasma may be free or substantially free of oxygen-containing species (e.g., oxygen ions, radicals, atomic oxygen). For example, oxygen-containing gas is not used to generate the hydrogen plasma. In some embodiments, oxygen-containing gas (e.g., $O_2$ gas) is not flowed into the reaction chamber during the hydrogen plasma step.

In some embodiments oxygen-containing gas is not used to generate the hydrogen plasma. In some embodiments, oxygen-containing gas (e.g., $O_2$ gas) is not flowed into the reaction chamber during the hydrogen plasma step.

In some embodiments, the second reactant does not comprise any species generated from nitrogen. Thus, in some embodiments reactive species are not generated from a gas containing nitrogen. In some embodiments a second reactant comprising reactive species is generated from a gas that does not contain nitrogen. For example in some embodiments a second reactant may comprise a plasma generated from a gas that does not contain nitrogen. In some embodiments the second reactant may be generated from a gas containing less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments a second reactant does not comprise $N_2$, $NH_3$ or $N_2H_4$.

In some embodiments, a hydrogen plasma may be free or substantially free of nitrogen-containing species (e.g., nitrogen ions, radicals, atomic nitrogen). For example, nitrogen-containing gas is not used to generate the hydrogen plasma. In some embodiments, nitrogen-containing gas (e.g., $N_2$ gas) is not flowed into the reaction chamber during the hydrogen plasma step.

However, in some other embodiments, nitrogen reactive species in the form of plasma, radicals of nitrogen, or atomic nitrogen in one form or another are also provided. Thus, in some embodiments the second reactant may comprise reactive species formed from compounds having both N and H, such as $NH_3$ and $N_2H_a$, a mixture of $N_2/H_2$ or other precursors having an N—H bond. In some embodiments the second reactant may be formed, at least in part, from $N_2$. In some embodiments the second reactant may be formed, at least in part, from $H_2$ and $N_2$, where the $H_2$ and $N_2$ are provided at a flow ratio ($H_2/N_2$), from about 100:1 to about 1:100, from about 20:1 to about 1:20, from about 10:1 to about 1:10, from about 5:1 to about 1:5 and/or from about 2:1 to about 4:1, and in some cases 1:1. For example, a hydrogen-containing plasma for depositing SiOC can be generated using both $N_2$ and $H_2$ at one or more ratios described herein.

In some embodiments the gas used to generated reactive species, such as plasma, may consist essentially of argon or another noble gas. In some embodiments, a plasma power used for generating a hydrogen-containing plasma can be about 5 Watts (W) to about 5000 W, 10 W to about 2,000 W, about 50 W to about 1000 W, about 100 W to about 1000 W or about 100 W to about 500 W. In some embodiments, a plasma power used for generating a hydrogen-containing plasma can be about 100 W to about 300 W. In some embodiments, hydrogen containing plasma may also comprise argon or another noble gas.

SiOC Film Characteristics

SiOC thin films deposited according to some of the embodiments discussed herein may achieve impurity levels or concentrations below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 30 at/o, below about 20 at %, below about 15 at %, or below about 10 at %. As used herein, an impurity may be considered any element other than Si, O, and/or C. In some embodiments the thin films do not comprise argon.

In some embodiments, the deposited SiOC films do not comprise an appreciable amount of hydrogen. However, in some embodiments a SiOC film comprising hydrogen is deposited. In some embodiments, the deposited SiOC films comprises less than about 30 at %, less than about 20 at %, less than about 15 at %, less than about 10 at % or less than about 5 at % of hydrogen. In some embodiments the thin films do not comprise argon.

As used herein, the term step coverage refers to the average thickness of a film deposited on a vertical surface of a three dimensional feature divided by the average thickness of the film deposited on a horizontal surface of a three dimensional feature. As described herein above, the step coverage of a formed or deposited SiOC film may be controlled by selecting an appropriate plasma power to generate the second reactant in a PEALD process according to some embodiments. In some embodiments the plasma power may be selected from a given range, for example form 50 W to 1000 W to achieve a SiOC film with a desired step coverage. In some embodiments a higher plasma power may result in a SiOC film having a high step coverage for three dimensional features having an aspect ratio of from about 1 to about 3

As used herein the term wet etch rate ratio (WERR) refers to the ratio of the wet etch rate of a film deposited on a vertical surface of a three dimensional feature to the wet etch rate of the film deposited on a horizontal surface of the feature. As described herein above, the WERR of a formed or deposited SiOC film may be controlled by selecting an appropriate plasma power to generate the second reactant in a PEALD process according to some embodiments. In some embodiments the plasma power may be selected from a given range, for example form 50 W to 1000 W to achieve a SiOC film with a desired WERR. In some embodiments a higher plasma power may result in a SiOC film having a lower WERR for a three dimensional features having an aspect ratio of from about 1 to about 3.

In addition, as discussed above the WER and WERR can be modified with a post deposition plasma treatment. In some embodiments a SiOC film deposited on a three-dimensional structure is treated with a nitrogen or oxygen plasma to improve the WER on the sidewall.

In some embodiments where the deposited SiOC film is subjected to an etch, such as a wet etch, the SiOC thin film may be present on vertical surfaces of the substrate and substantially no SiOC may be present on horizontal surfaces of the substrate. In some other embodiments where the deposited SiOC film is subjected to an etch, such as a wet etch, the SiOC thin film may be present on horizontal surfaces of the substrate and substantially no SiOC may be present on vertical surfaces of the substrate.

According to some embodiments, the SiOC thin films may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. In some embodiments step coverage and pattern loading effects can be greater than about 200%, 300%, 500%, 700%, 1000% or greater.

As discussed above, in some embodiments the step coverage can be increased by a post deposition plasma treatment in which a SiOC film on a three-dimensional structure is contacted with a hydrogen plasma. The post deposition plasma treatment may, for example, increase the step coverage from less than 100% to greater than 100% and even greater than 150% in some instances.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three dimensional structure relative to the film thickness on the sidewall or bottom of the three dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments the growth rate of the film on a vertical and/or horizontal surface of a substrate is from about 0.01 Å/cycle to about 5 Å/cycle, from about 0.05 Å/cycle to about 2 Å/cycle. In some embodiments the growth rate of the film is more than about 0.05 Å/cycle, more than about 0.1 Å/cycle, more than about 0.15 Å/cycle, more than about 0.3 Å/cycle, more than about 0.3 Å/cycle, more than about 0.4 Å/cycle. In some embodiments the growth rate of the film on one surface, such as a vertical surface of a three dimensional feature may be different than the growth rate of the film on a different surface, such as a horizontal surface.

In some embodiments, SiOC films are deposited on a vertical and/or horizontal surface to a thickness of from about 3 nm to about 50 nm, from about 5 nm to about 30 nm, from about 5 nm to about 20 nm. In some embodiments the thicknesses of portions of the deposited SiOC film may be controlled by selecting an appropriate plasma power as described herein above, and/or by post deposition plasma treatment of the SiOC film. For example, in some embodiments the thickness of the SiOC film deposited on a horizontal surface of a substrate may be controlled to achieve a desired value while the thickness of the SiOC film deposited on a vertical surface of the substrate may be controlled to achieve a second, different desired value. These thicknesses can be achieved in feature sizes (width) below about 100 nm, about 50 nm, below about 30 nm, below about 20 nm, and in some cases below about 15 nm. According to some embodiments, a SiOC film is deposited on a three dimensional structure and the thickness at a sidewall may be slightly even more than 10 nm. In some embodiments SiOC films of greater than 50 nm can be deposited. In some embodiments SiOC films of greater than 100 nm can be deposited. In some embodiments, SiOC films are deposited to a thickness of more than about 1 nm, more than about 2 nm, more than about 3 nm, more than about 5 nm, more than about 10 nm.

In some embodiments a post deposition treatment of a SiOC film with hydrogen plasma as described herein can reduce the thickness on the top surface of a trench while increasing the thickness at the sidewalls and bottom of the trench.

According to some embodiments SiOC films with various wet etch rates (WER) may be deposited on horizontal and/or vertical surfaces of a substrate by a controlled deposition process as described herein. In some embodiments the WER of different portions of the deposited SiOC film may be controlled to be different by selecting an appropriate plasma power as described herein above. For example, in some embodiments the WER of the SiOC film deposited on a horizontal surface of a substrate may be controlled to achieve a desired value while the WER of the SiOC film deposited on a vertical surface of the substrate may be controlled to achieve a second, different desired value. When using a blanket etch in 0.5 wt % dHF (nm/min), a portion of an SiOC film may have WER values of less than about 5, less than about 4, less than about 2, or less than about 1. In some embodiments SiOC films may have WER values significantly less than 1. In some embodiments SiOC films may have WER values less than about 0.3, less than about 0.2, or less than about 0.1. In some embodiments SiOC films may have WER values less than about 0.05, less than about 0.025, or less than about 0.02. In some embodiments the deposited film may have a WER of from about 0.1 to about 15 on a vertical surface of a three dimensional feature and a WER that is about 10%, 25%, 50%, 100%, 250%, 500%, or 1000% greater on a horizontal surface of a three dimensional feature. In some embodiments the deposited film may have a WER of from about 0.1 to about 15 on a vertical surface of a three dimensional feature and a WER that is about 10%, 25%, 50%, or 100% smaller on a horizontal surface of a three dimensional feature.

The blanket WER in 0.5 wt % dHF (nm/min) relative to the WER of thermal oxide may be less than about 3, less than about 2, less than about 1, or less than about 0.5 for. In some embodiments the blanket WER in 0.5 wt % dHF relative to the WER of TOX may be less than about 0.4, 0.3, 0.2, or 0.1.

In some embodiments wherein a PEALD process is carried out at temperatures less than about 100° C., the blanket WER in 0.5 wt % dHF (nm/min) relative to the WER of thermal oxide may be less than about 10, less than about 5, less than about 3, and less than about 2, or less than about 1.

In some embodiments the etch rate of portions of the film can be controlled, as described herein above, by selecting an appropriate plasma power based on the aspect ratio of a three dimensional feature on which an SiOC film is to be deposited. Therefore, in some embodiments, the ratio (WERR) of the etch rate, such as a WER, of a SiOC film deposited on a vertical surface, such as a sidewall of a three dimensional feature, to the etch rate of a a SiOC film deposited on a horizontal surface, such as a top surface of a three dimensional feature may be controlled by selecting an appropriate plasma power as described herein. In some embodiments the plasma power may be selected to achieve a ratio of the etch rate of the SiOC film deposited on a vertical surface of the substrate to the etch rate of the SiOC film deposited on a horizontal surface of the substrate in in 0.5 wt % dHF of from about 0.1 to about 20, from about 0.2 to about 15, from about 0.5 to about 10, from about 1 to about 2, from about 2 to about 5, from about 5 to about 10, from about 10 to about 20, or in some cases greater than or equal to about 20.

And in some embodiments, a ratio (WERR) of a sidewall etch rate, for example a WER of a SiOC film deposited on a substantially vertical three dimensional feature, such as a fin or trench relative to the etch rate of the SiOC film deposited on a substantially horizontal surface, such as the top surface of a three dimensional feature, such as fin or trench, in 0.5 wt % dHF may be from about 1 to about 2, from about 2 to about 5, from about 5 to about 10, from about 10 to about 20, or in some cases greater than or equal to about 20. In some embodiments a ratio (WERR) of the WER of a SiOC film deposited on a vertical surface of a three dimensional feature to the WER of a SiOC film deposited on the top surface of a three dimensional feature may be equal to or greater than about 2, equal to or greater than about 5, equal to or greater than about 10, equal to or greater than about 15, or equal to or greater than about 20.

In some embodiments a ratio (WERR) of the WER of a SiOC film deposited on or in a substantially vertical surface of a three dimensional feature, for example a sidewall surface, to the WER of a SiOC film deposited on or in a substantially horizontal surface of a three dimensional feature, for example a top surface, may be from about 1 to about 0.5, from about 0.5 to about 0.2, from about 0.2 to about 0.1, from about 0.1 to about 0.05, or in some cases less than about 0.05. In some embodiments a ratio (WERR) of the WER of a SiOC film deposited on a substantially vertical surface of a three dimensional feature to the WER of a SiOC film deposited on a substantially horizontal surface of a three dimensional feature may be equal to or less than about 0.5, equal to or less than about 0.2, equal to or less than about 0.1, or equal to or less than about 0.05.

In some embodiments a ratio of the WER of a SiOC film deposited on or in a substantially vertical surface of a three dimensional feature, for example a sidewall surface, to a WER of TOX may be between about 5 to about 10, between about 2 to about 5, between about 1 to about 2, between about 0.5 to about 1, or between about 0.1 to about 0.5. In some embodiments a ratio of the WER of a SiOC film deposited on or in a substantially vertical surface of a three dimensional feature, for example a sidewall surface to a WER of TOX may be greater than or equal to about 0.1, greater than or equal to about 0.5, greater than or equal to about 1, greater than or equal to about 2, greater than or equal to about 5, or greater than or equal to about 10.

In some embodiments, SiOC formed according to one or more processes described herein can advantageously demonstrate a ratio (WERR) of a WER of a substantially vertical region to a WER of a substantially horizontal region of about 1, for example in 0.5 wt % dHF. For example, a ratio (WERR) of a wet etch rate of a SiOC thin film formed over substantially vertical surfaces (e.g., sidewall surfaces) to a wet etch rate of the SiOC thin film formed over substantially horizontal surfaces (e.g., top surfaces) of three dimensional structures on a substrate surface can be the same or substantially the same. In some embodiments, the ratio can be about 4 to about 0.5, about 2 to about 0.75, about 1.25 to about 0.8, or about 1.1 to about 0.9. These ratios can be achieved in features with aspect ratios of about 1.2 or more, about 1.5 or more, about 1.8 or more, about 2 or more, about 3 or more, about 5 or more or even about 8 or more.

In some embodiments, for example where a three dimensional feature, or a portion thereof, is disposed near or adjacent to a substantially flat or open portion of the substrate, the aspect ratio may be considered as the ratio of the vertical, or side portion of the three dimensional feature or portion to the horizontal, or top portion of the three dimensional feature or portion and may not take into account the dimensions of the open portion of the substrate. That is, in some embodiments the aspect ratio of a three dimensional feature, or a portion of a three dimensional feature may be considered the ratio of the height or depth of the feature or portion to the width of the feature or portion without taking into account the dimensions of any adjacent open portions of the substrate.

In some embodiments, SiOC formed according to one or more processes described herein can advantageously demonstrate a horizontal region to vertical region WERR of about 1, for example in 0.5 wt % dHF. For example, a ratio of a wet etch rate of SiOC thin film formed over horizontal surfaces (e.g., top surfaces) to a wet etch rate of the SiOC thin film formed over vertical surfaces (e.g., sidewall surfaces) of three dimensional structures on a substrate surface can be the same or substantially the same. In some embodiments, the ratio can be about 0.25 to about 2, about 0.5 to about 1.5, about 0.75 to about 1.25, or about 0.9 to about 1.1. These ratios can be achieved in features with aspect ratios of about 1.2 or more, about 1.5 or more, about 1.8 or more, about 2 or more, about 3 or more, about 5 or more or even about 8 or more.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % HF-dip process with an etching time of 5 minutes. In some embodiments less than about 2 nm of SiOC film may be removed in a 0.5 wt % HF-dip process with an etching time of 60 minutes.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % H F-dip process with an etching time of 5 minutes. In some embodiments less than about 2 nm of SiOC film may be removed in a 0.5 wt % HF-dip process with an etching time of 60 minutes.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOC thin film may contain up to about 70% oxygen on an atomic basis (at %). In some embodiments a SiOC film may comprise oxygen from about 10% to about 70%, from about 15% to about 50%, or from about 20% to about 40% on an atomic basis. In some embodiments a SiOC film may comprise at least about 20%, about 40% or about 50% oxygen on an atomic basis.

In some embodiments the deposited SiOC thin film may contain up to about 40% carbon on an atomic basis (at %). In some embodiments a SiOC film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited SiOC thin film may contain up to about 50% silicon on an atomic basis (at %). In some embodiments a SiOC film may comprise silicon from about 10% to about 50%, from about 15% to about 40%, or from about 20% to about 35% on an atomic basis. In some embodiments a SiOC film may comprise at least about 15%, about 20%, about 25% or about 30% silicon on an atomic basis.

In some embodiments the deposited SiOC thin film may contain up to about 40% sulphur on an atomic basis (at %).

In some embodiments a SiOC film may comprise sulphur from about 0.01% to about 40%, from about 0.1% to about 40%, from about 0.5% to about 30%, or from about 1% to about 20% on an atomic basis. In some embodiments a SiOC film may comprise at least about 1%, about 10% or about 20% sulphur on an atomic basis. In some embodiments, the deposited SiOC films do not comprise an appreciable amount of nitrogen. However, in some embodiments a SiOC film comprising nitrogen is deposited. In some embodiments, the deposited SiOC films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the SiOC thin films do not comprise nitrogen.

As discussed above, in some embodiments a SiOC film may comprise Si—C bonds and/or Si—O bonds. In some embodiments a SiOC film may additionally comprise Si—N bonds. In some embodiments a SiOC film may additionally comprise Si—S bonds. In some embodiments a SiOC film may comprise Si—C bonds and Si—O bonds and may not comprise Si—N bonds. In some embodiments a SiOC film may comprise Si—N bonds and Si—O bonds and may not comprise Si—C bonds. In some embodiments a SiOC film may comprise Si—N bonds and Si—C bonds and may not comprise Si—O bonds. In some embodiments a SiOC film may comprise Si—S bonds, Si—C bonds, and Si—O bonds and may not comprise Si—N bonds. In some embodiments a SiOC film may comprise Si—S bonds and Si—C bonds, and may not comprise Si—O bonds. In some embodiments a SiOC film may comprise Si—S bonds, and Si—O bonds and may not comprise Si—C bonds. In some embodiments the SiOC films may comprise more Si—O bonds than Si—C bonds, for example a ratio of Si—O bonds to Si—C bonds may be from about 1:1 to about 10:1. In some embodiments a deposited SiOC film may comprise one or more of SiN, SiO, SiC, SiCN, SiON, SiOSC, SiSC, SiOS, and/or SOC.

In some embodiments a SiOC film is not a low-k film, for example a SiOC film is not a porous film. In some embodiments a SiOC is a continuous film. In some embodiments a SiOC film has a k-value that is less than about 10. In some embodiments a SiOC film has a k-value that is less than about 7. In some embodiments a SiOC film has a k-values from about 2 to about 10. In some embodiments a SiOC film has a k-value that is less than about 5.0, less than about 4.5, less than about 4.3, less than about 4.1. In some embodiments a SiOC film has a k-value that from about 3.0 to about 7, from about 3.0 to about 5.5, from about 3.0 to about 5.0, from about 3.5 to about 4.8, from about 3.5 to about 4.7. In some embodiments a SiOC film has a k-value that is more than the k-value of any low-k film. In some embodiments a SiOC film has a k-value that is more than pure $SiO_2$.

In some embodiments SiOC films deposited according to the present disclosure do not comprise a laminate or nanolaminate structure.

In some embodiments a SiOC film deposited according to the present disclosure is not a self-assembled monolayer (SAM). In some embodiments a SiOC film deposited according to the present disclosure does not consist of separate, individual molecules which are not bonded to each other. In some embodiments a SiOC film deposited according to the present disclosure comprises a material which is substantially bonded or linked together. In some embodiments a SiOC film deposited according to the present disclosure is not a functional layer, is not amino-functionalized, and/or is not used as a functional surface. In some embodiments a SiOC film deposited according to the present disclosure is not terminated with —$NH_2$ groups. In some embodiments a SiOC film deposited according to the present disclosure does not contain a substantial amount of —$NH_2$ groups.

Additional Film Materials

In some embodiments the formation of thin films comprising material other than SiOC may be deposited and/or controlled by the processes as described herein. For example, in some embodiments metal oxide thin films and the formation of metal oxide films may be controlled as described herein by PEALD processes that do not include oxygen plasma or excited oxygen species. In these embodiments a different metal precursor is used in place of the silicon precursor in the processes as described herein. In some embodiments the formation of titanium oxide, niobium oxide, tantalum oxide, tungsten oxide, TiO(CN) and/or aluminum oxide thin films may be controlled by PEALD processes as described herein. In some embodiments titanium oxide, TiO(CN), niobium oxide, tantalum oxide, tungsten oxide, and/or aluminum oxide thin films may be deposited by PEALD processes as described herein.

In some embodiments a metal oxide film may comprise more than one metal oxide. The different metals may be provided by the same precursor, or by two or more different metal precursors that are be provided in one or more deposition cycles.

In some embodiments oxide films comprising both silicon and metal may be deposited as described herein by PEALD processes that do not include oxygen plasma or excited oxygen species. In some embodiments an oxide is deposited that comprises both metal and silicon. In some embodiments an oxide film may comprise a mixture of a metal oxide and silicon oxide. In some embodiments an oxide film may comprise a metal silicate. For example, a film may comprise silicon oxide and one or more of a transition metal oxide, such as $ZrO_2$, $HfO_2$, or $TiO_2$, $Al_2O_3$, lanthanide (+Sc+Y) oxides, Ta2O5, or Nb2O5.

In some embodiments a metal precursor is used, along with a silicon precursor in the processes as described herein. In some embodiments a deposition cycle for depositing a metal oxide and a deposition cycle for depositing a silicon oxide may be provided at a selected ratio in a deposition process in order to deposit a film having a desired composition.

In some embodiments a deposition process may comprise a single deposition cycle comprising alternately and sequentially contacting a substrate with a first metal precursor, a second silicon precursor and a third plasma reactant. The metal and silicon precursors and the third reactant can be as described herein for deposition of metal oxides and silicon oxides. The deposition cycle may begin with provision of the metal reactant, provision of the silicon reactant or provision of the third reactant. As described herein, provision of each of the reactants may be separated by a purge step in which excess reactants and reaction byproducts are removed from the reaction space. In some embodiments the ratio of the metal precursor and the silicon precursor is selected and/or adjusted to provide a mixed metal oxide film with the desired composition.

In some embodiments the metal precursors used to deposit films comprising metal oxide by the processes described herein may comprise volatile compounds comprising the desired metal and oxygen. A list of metal precursors to be used to deposited metal oxide films by PEALD processes that do not include oxygen plasma or excited species of oxygen as described herein is provided in Table 1.

TABLE 1

PRECURSORS FOR THE DEPOSITION OF METAL OXIDE THIN FILMS

| Precursor compound | Film material |
|---|---|
| Aluminum(III)ethoxide | $Al_2O_3$ |
| Niobium(V)ethoxide | $Nb_2O_5$ |
| Tantalum(V)ethoxide | $Ta_2O_5$ |
| Titanium (IV) ethoxide | $TiO_2$ |
| Titanium (IV) methoxide | $TiO_2$ |
| Titanium (IV) isopropoxide (TTIP) | TiO(CN) |
| Pentamethylcyclopentadienyltitanium trimethoxide | $TiO_2$ |
| W(thd)4 | $WO_x$ |

In some embodiments the metal precursor used to deposit metal oxide films by the processes described herein may comprise volatile compounds of formula:

$$M(OR^I)_{x-y}R^{II}_y$$

Wherein $R^I$ may be an independently selected hydrocarbon group and wherein M is a metal or Ge, for example a transition metal or Ge, Al, Ga, In, Sn, Pb, Bi, Sb, wherein x+y is equal to the oxidation state, or number of bonds of the metal atom, for example 3, 4, 5, or 6. In some embodiments where there is double or triple bonding of the metal atom, each double or triple bond may be counted two or three times when determining the value of x+y. In some embodiments $R^{II}$ may be any ligand comprising carbon, hydrogen, nitrogen, halogen and/or oxygen. In some embodiments M is a transition metal selected from the group: Ti, V, Cr, Mn, Zr, Nb, Mo, Ru, Rh, Pd, Ag, Au, Hf, Ta, W, Re, Os, Ir and Pt. In some embodiments M is a transition metal selected from the group: Cu, Fe, Co, Ni. In some embodiments M is a transition metal selected from the group: Au, Pt, Ir, Pd, Os, Ag, Re, Rh, and Ru. In some embodiments $R^I$ may be an independently selected C1-C5 alkyl ligand, such as a methyl, ethyl, n-propyl, isopropyl, tertbutyl, or pentyl ligand. In some embodiments $R^I$ can comprise oxygen or nitrogen or another heteroatom. In some embodiments $R^{II}$ may comprise, for example an alkenyl, alkynyl, cyclic hydrocarbons, amine, alkyamine, phenyl, carbonyl, aldehyde, ester, ether, carboxyl, peroxy, hydroperoxy, thiol, acrylate, or methacrylate ligand. In some embodiments at least one of the ligands of the above formula above comprises oxygen. In some embodiments M can be also be a group 1 or 2 metal element.

In some embodiments the metal precursor used to deposit metal oxide films by the processes described herein may comprise volatile compounds of formula:

$$M(OR^I)_x$$

Wherein $R^I$ may be an independently selected alkyl group and wherein M is metal or Ge, for example transition metal or Ge, Al, Ga, In, Sn, Pb, Bi, Sb and wherein x is equal to the oxidation state, or number of bonds of the metal atom, for example 3, 4, 5, or 6. In some embodiments where there is double or triple bonding of the metal atom, each double or triple bond may be counted two or three times when determining the value of x. In some embodiments $R^I$ may be an independently selected C1-C5 alkyl ligand, such as methyl, ethyl, n-propyl, isopropyl, tertbutyl, or pentyl ligand. In some embodiments M is a transition metal selected from the group: Ti, V, Cr, Mn, Zr, Nb, Mo, Ru, Rh, Pd, Ag, Au, Hf, Ta, W, Re, Os, Ir and Pt. In some embodiments M is a transition metal selected from the group: Cu, Fe, Co, Ni. In some embodiments M is a transition metal selected from the group: Au, Pt, Ir, Pd, Os, Ag, Re, Rh, and Ru. In some embodiments M may be a rare earth element, for example Sc, Y, La, Ce, or Nd.

In some embodiments the metal precursor used to deposit metal oxide films by the processes described herein may comprise at least one multidentate ligand, such as a bidentate ligand, for example a betadiketonate ligand (acac, thd) or another multidentate/bidentate ligand which is bonded to the metal atom through at least one oxygen. In some embodiments the metal precursor used to deposit metal oxide films by the processes described herein may comprise a cyclic ligand, such as cyclopentadienyl ligand.

In some embodiments the metal precursor used to deposit metal oxide films by the processes described herein may comprise an alkoxide precursor or alkoxide ligand. In some embodiments the metal precursor used to deposit metal oxide films by the processes described herein comprises at least one metal-oxygen bond. In some embodiments the metal precursor used to deposit metal oxide films by the processes described herein does not comprise a metal-oxygen bond, but comprises oxygen in the ligand. In some embodiments the metal precursor comprises metal or Ge, for example transition metal or Ge, Al, Ga, In, Sn, Pb, Bi, Sb. In some embodiments the metal precursor comprises group 1 or 2 metal element. In some embodiments M may be a rare earth element, for example Sc, Y, La, Ce, or Nd.

In some embodiments a metal oxide films may be deposited on a substrate comprising a photoresist or other organic material according to the processes described herein. In some embodiments a metal oxide film may be deposited on a substrate that may otherwise be destroyed by a PEALD process which includes oxygen plasma.

In some embodiments the metal oxide films deposited according to the PEALD processes as described herein may have wet etch resistances that are higher than the wet etch resistance of similar metal oxide films deposited by PEALD processes that include oxygen plasma or excited oxygen species. As described herein, in some embodiments the formation of metal oxide films may be controlled by selecting a plasma power from a range, for example a range as described herein with respect to the deposition of SiOC, in a PEALD process in order to achieve a desired step coverage and/or WERR. That is, in some embodiments the process conditions used to control the formation of SiOC films as described herein can be used to control the formation of metal oxide films.

In some embodiments the second reactants used in the PEALD processes for depositing metal oxide thin films are the same as the second reactants described herein with respect to the deposition of SiOC. In some embodiments the second reactant comprises a plasma generated in a gas comprising a noble gas, such as Ar. As mentioned above, in some embodiments the second reactant is a plasma generated in a gas that does not comprise oxygen. In some embodiments the second reactant comprises plasma generated in Ar, plasma generated in Ar and $N_2$ or plasma generated in Ar and $H_2$. In some embodiments the second reactant can be selected to control the amount of particular components of the metal oxide film, such as carbon and/or nitrogen. In addition, the plasma power may be controlled to adjust the composition of the film.

In some embodiments a metal oxide comprising titanium is deposited by a PEALD process that does not use an oxygen plasma or other oxygen reactant. For example, a titanium oxide film may be deposited by a PEALD process using titanium isopropoxide (IV) (TTIP) in combination with a non-oxygen plasma. In some embodiments TTIP is utilized in a PEALD process in combination with a plasma generated in Ar, a plasma generated in a gas comprising Ar and nitrogen, or a plasma generated in a gas comprising Ar and hydrogen. In some embodiments, a titanium oxide film comprising carbon is deposited by a PEALD process in which a titanium reactant such as TrIP is utilized in combination with a plasma generated in a noble gas, such as in pure Ar gas. The amount of carbon may be tuned by varying the plasma power. In some embodiments a titanium oxide film comprising carbon and nitrogen (TiO(CN)) is deposited by a PEALD process using a titanium reactant such as TTIP in combination with a plasma generated in a gas comprising nitrogen, such as in a gas comprising Ar and $N_2$.

EXAMPLES

Figure 4:
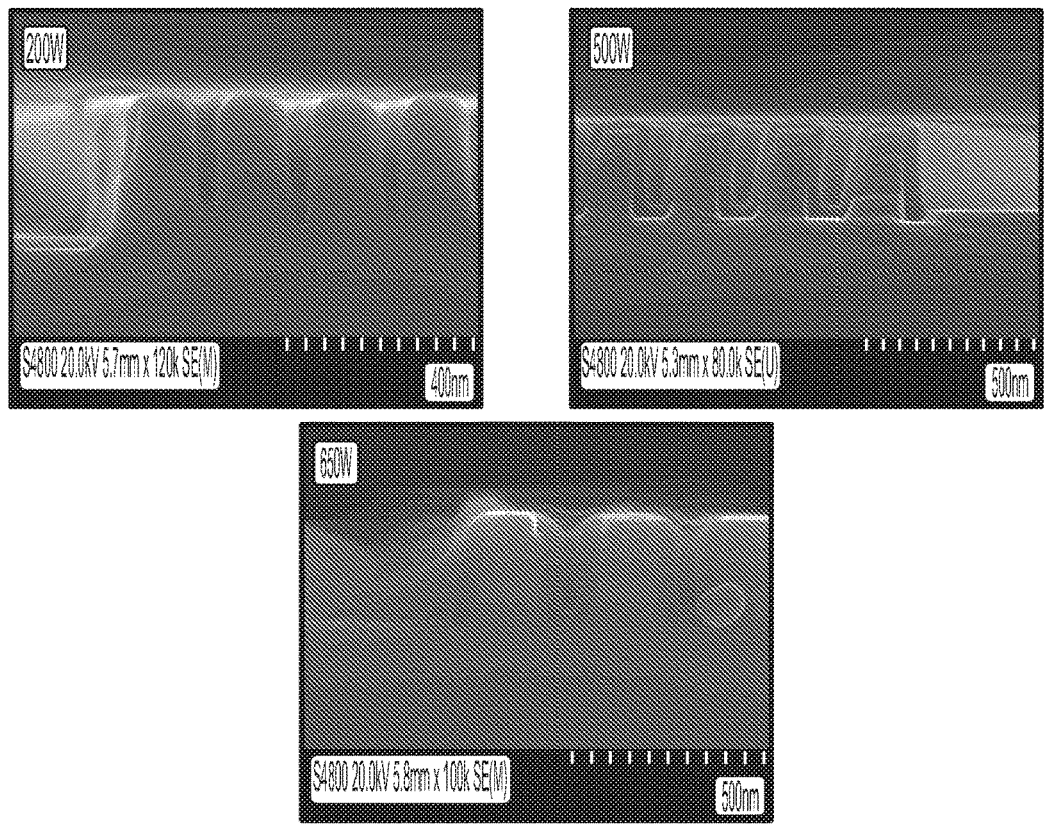
FIG. 4 is a series of scanning electron micrographs showing example SiOC films deposited by PEALD processes as described herein and according to some embodiments with plasma power varying from 200 W to 650 W.

A direct plasma PEALD reactor was used to deposit sample SiOC films according to the processes described herein. 3-Methoxypropyl(trimethoxysilane) (MPTMS) was used as the silicon precursor. Experiments were carried out at a deposition temperature of 200° C. A plasma was generated from a gas consisting of an $H_2$/Ar mixture with flow rates of 100/1200 sccm. The pressure used was 4 Torr and pulse/purge/Rf/purge lengths were 2/4/4/0.5 s. The growth per cycle (GPC) of a process with these parameters is typically about 0.2 Å/cycle. The plasma power was varied from 200 W to 650 W. FIG. 4 is a series of scanning electron micrographs showing the example SiOC films deposited on substrates comprising a trench pattern. The film deposited with a plasma power of 200 W included 1500 cycles, while the films deposited with plasma powers of 500 W and 650 W included 2000 cycles.

Figure 5:
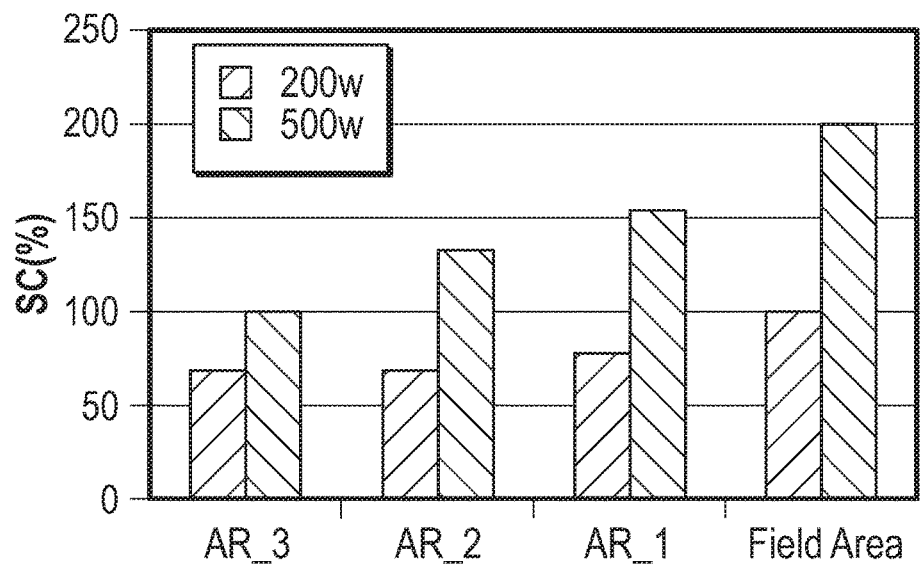
FIG. 5 is a bar graph showing the step coverage of example SiOC films deposited by PEALD processes on three dimensional structure with varying aspect ratios for plasma powers of 200 W and 500 W as described herein and according to some embodiments.

It can be seen that the plasma power has an influence on the step coverage and on the selectivity of vertical vs. horizontal surface GPC. By using the highest power setting of 650 W no film can be seen on the trench top areas and also nothing on the open space field areas. The GPC on the trench sidewalls on the other hand is substantial. Using lower powers of 500 and 200 W film in the top and field areas can also be seen. The step coverage also depends on the structure aspect ratio (AR). FIG. 5 shows how this changes when using two different power settings.

Figure 6A:
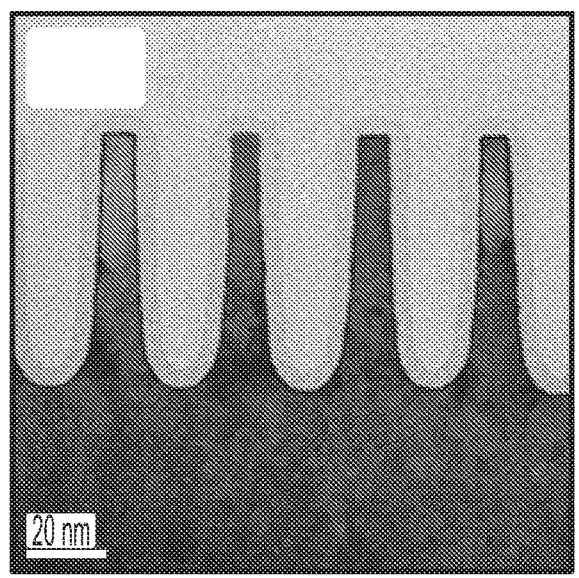
FIG. 6A is a tunneling electron micrograph of an example SiOC film deposited on a three dimensional feature with an aspect ratio of about 3 by a PEALD process with a plasma power of 200 W as described herein and according to some embodiments.
Figure 6B:
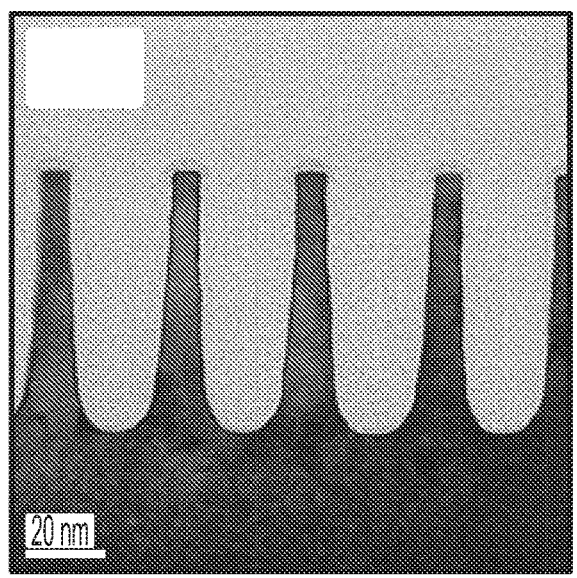
FIG. 6B is a tunneling electron micrograph of the example SiOC film of FIG. 6A after being subjected to a wet etch as described herein and according to some embodiments.

FIG. 6A is a tunneling electron micrograph of an example SiOC film deposited on a three dimensional feature with an aspect ratio of about 3 by a PEALD process with a plasma power of 200 W while FIG. 6B is a tunneling electron micrograph of the example SiOC film of FIG. 6A after being subjected to 2 minutes etching in a 0.5 wt % dilute HF solution. The deposited SiOC film on the sidewall and bottom of the structure was etched away, while in the top area film remained.

Figure 6C:
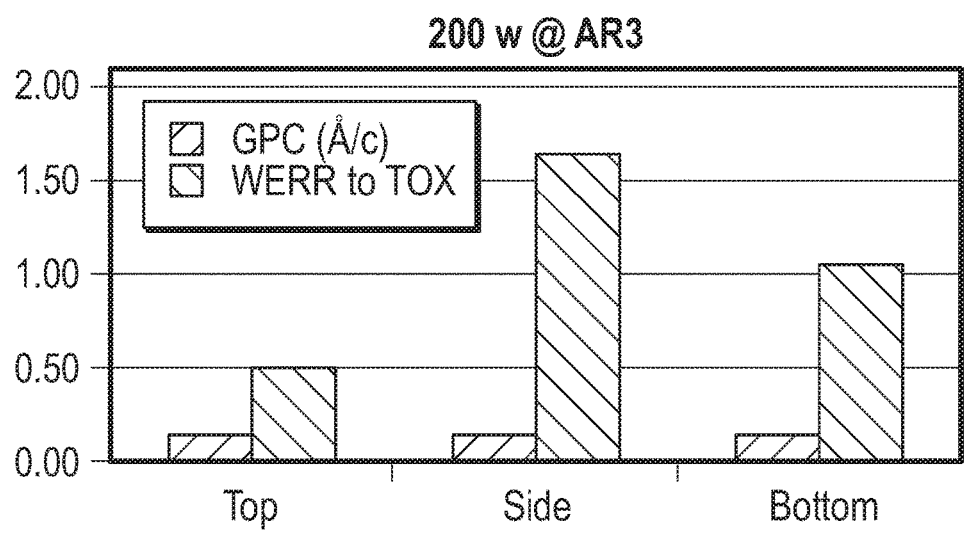
FIG. 6C is a bar graph showing the growth per cycle (GPC) and wet etch rate ratio (WERR) for different areas of an example SiOC films deposited on a three dimensional feature with an aspect ratio of about 3 by a PEALD process with a plasma power of 200 W as described herein and according to some embodiments.

As can be seen in FIG. 6C, and as in the case of lower aspect ratio, e.g. AR 1.4 shown in the FIG. 5, the SiOC film can also be deposited on both in the top and bottom areas of the structure. With an increase in the AR of the structure, the WER of the SiOC deposited on the bottom of the structure decreased. Thus, after etching the SiOC film deposited on both the top and bottom of the structure is left. The GPC and WER were found to be almost same in these two areas.

Figure 7A:
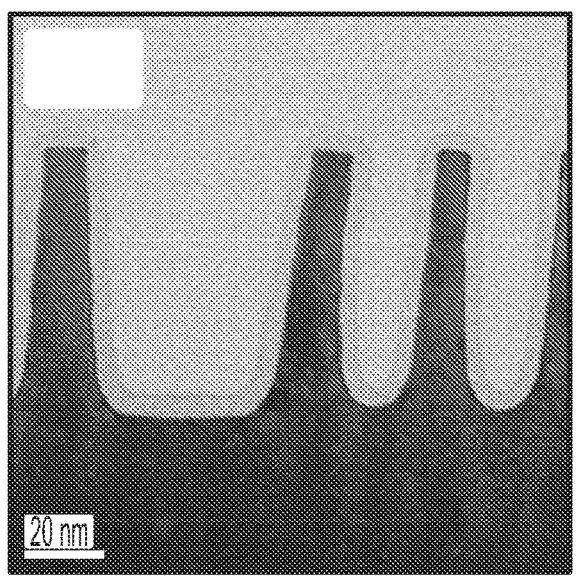
FIG. 7A is a tunneling electron micrograph of an example SiOC film deposited on a three dimensional feature with an aspect ratio of about 1.4 by a PEALD process with a plasma power of 200 W as described herein and according to some embodiments.
Figure 7B:
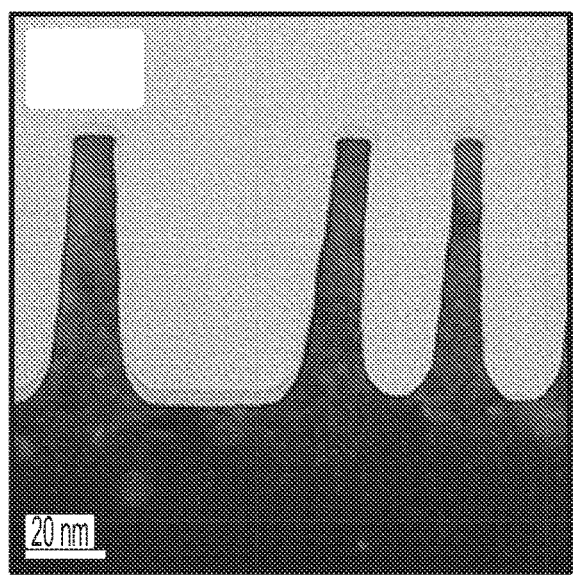
FIG. 7B is a tunneling electron micrograph of the example SiOC film of FIG. 7A after being subjected to a wet etch as described herein and according to some embodiments.

FIG. 7A is a tunneling electron micrograph of an example SiOC film deposited on a three dimensional feature with an aspect ratio of about 1.4 by a PEALD process with a plasma power of 200 W and including 400 deposition cycles while FIG. 7B is a tunneling electron micrograph of the example SiOC film of FIG. 7A after being subjected to 2 minutes of a wet etch in 0.5% dilute HF.

Figure 8A:
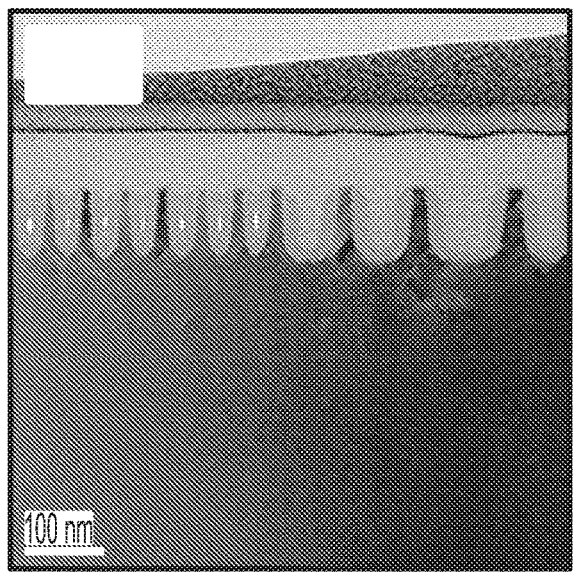
FIG. 8A is a tunneling electron micrograph of an example SiOC film deposited on three dimensional features with an aspect ratio of about 1 (right) and about 3 (left) by a PEALD process with a plasma power of 650 W as described herein and according to some embodiments.
Figure 8B:
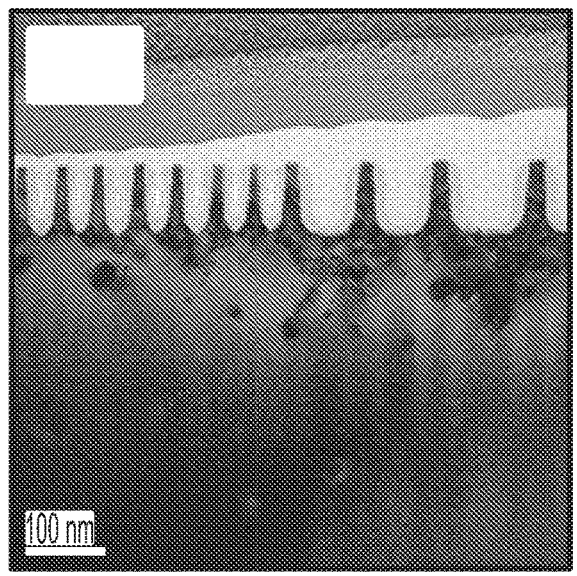
FIG. 8B is a tunneling electron micrograph of the SiOC film of FIG. 8A after being subjected to a wet etch as described herein and according to some embodiments.
Figure 8C:
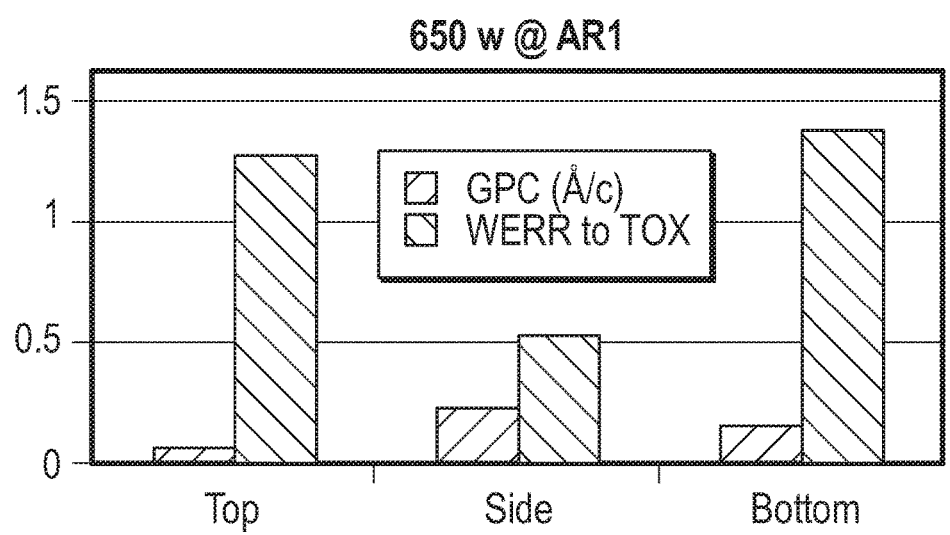
FIG. 8C is a bar graph showing the growth per cycle (GPC) and wet etch rate ratio (WERR) for different areas of an example SiOC films deposited on a three dimensional feature with an aspect ratio of about 1 by a PEALD process with a plasma power of 650 W as described herein and according to some embodiments.
Figure 8D:
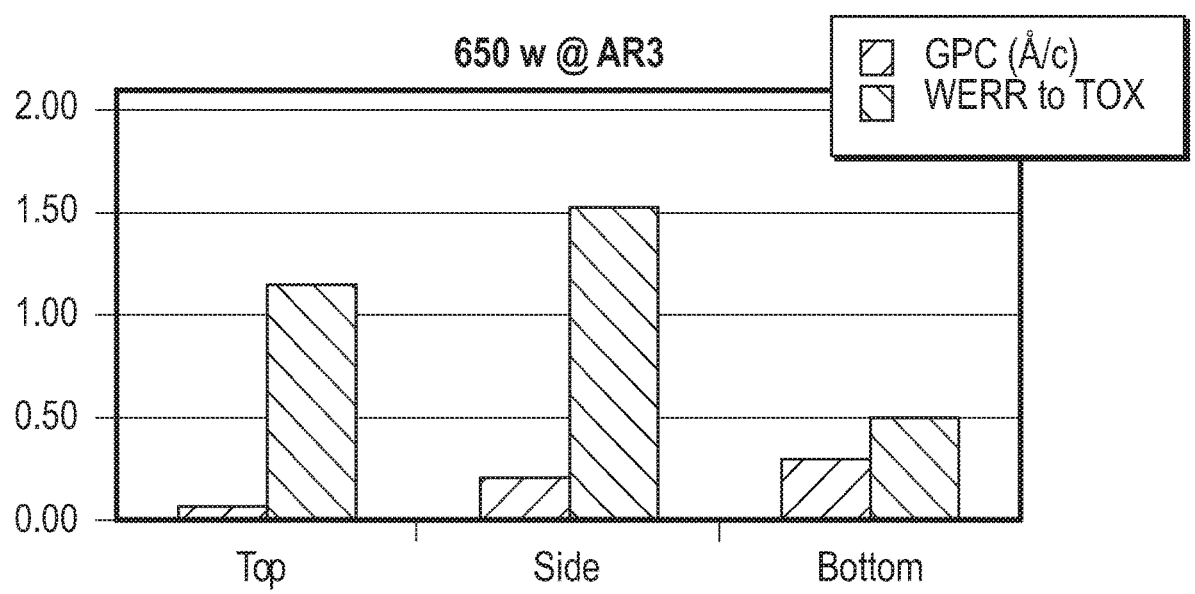
FIG. 8D is a bar graph showing the growth per cycle (GPC) and wet etch rate ratio (WERR) for different areas of an example SiOC films deposited on a three dimensional feature with an aspect ratio of about 3 by a PEALD process with a plasma power of 650 W as described herein and according to some embodiments.

FIGS. 8A and 8B shows two TEM images of trenches having aspect ratios of 1 (right) and 3 (left) with SiOC films deposited by a PEALD process as described herein with a plasma power of 650 W and including 700 deposition cycles. FIG. 8A shows the as deposited SiOC film while FIG. 8B shows the example SiOC film of FIG. 8A after being subjected to a 2 minute wet etch in 0.5 wt % dilute HF. FIG. 8C is a bar graph showing the growth per cycle (GPC) and wet etch rate ratio (WERR) for different areas (top, side, bottom) of the example SiOC films deposited on a three dimensional feature with an aspect ratio of about 1. The GPC on the sidewall and bottom is much higher than that on the top. FIG. 8D shows the difference of GPC and WER in those three areas for the example SSiOC film deposited on a three-dimensional feature with an aspect ratio of about 3. In the bottom area, film was deposited with highest GPC, and it also shows much lower WER than that on the top and sidewall. This result indicates that by introducing higher deposition power and HF etching treatment, it is possible to achieve film just on the bottom are. And as shown in FIG. 8B, the film in the top area can be easily etched away while film on the sidewall and bottom will remain. It was found that the ratio of the WER of the film to the WER of thermal silicon oxide is much less than that in top and bottom area. Thus it is possible to achieve film just on the sidewall by introducing high power and HF etching. But it is limited to a structure with relatively lower AR, for example below 3.

Sample SiOC film composition from samples deposited at 200° C. and 250° C. using a plasma power of 200 W was measured using XPS. The carbon content was substantially low, at about 1-3 at. %. The k-value of a 10 nm 200° C./200 W film was measured and found to be about 4.

Figure 9A:
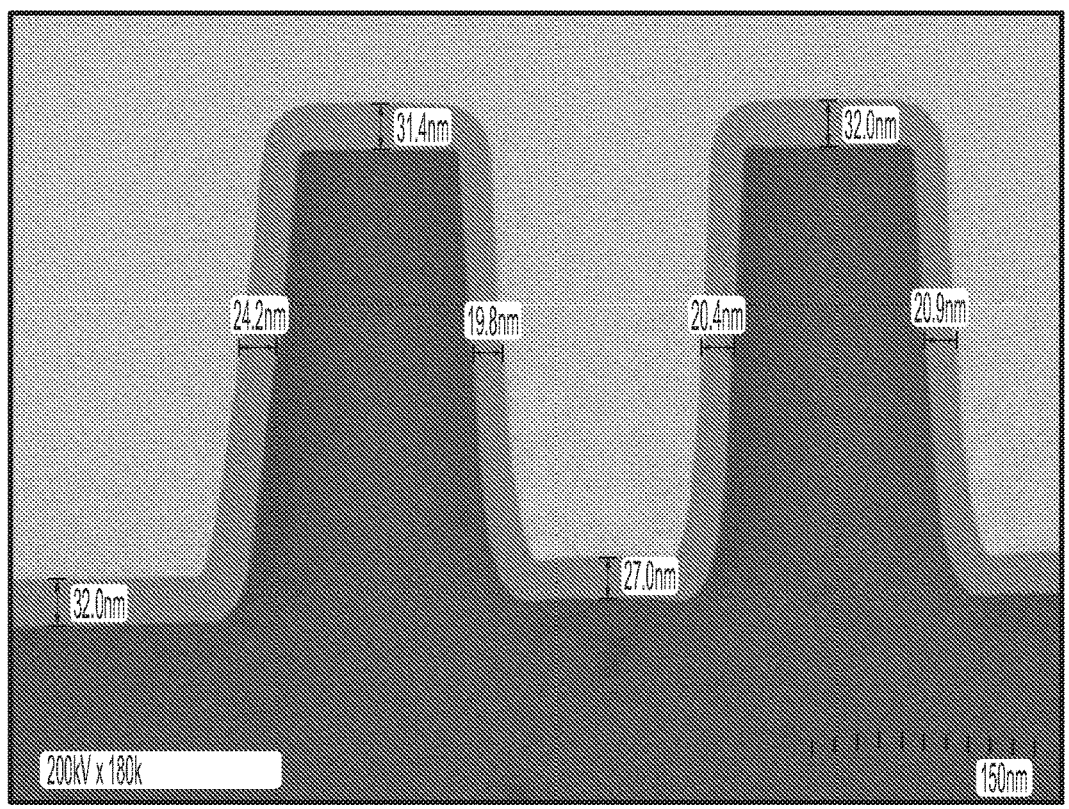
FIG. 9A is a scanning electron micrograph of an example SiOC film deposited on a three dimensional feature by a PEALD process as described herein and according to some embodiments.
Figure 9B:
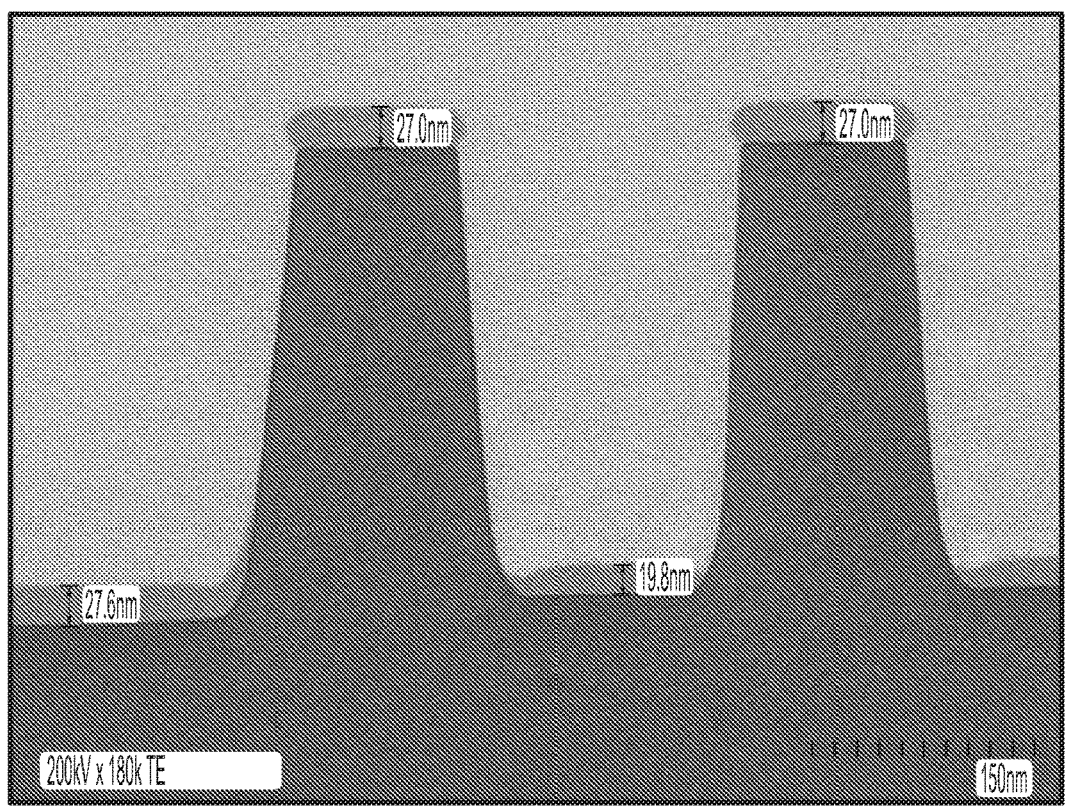
FIG. 9B is a scanning electron micrograph of the example SiOC film of FIG. 10A after being subjected to a wet etch as described herein and according to some embodiments.

FIG. 9A is a scanning electron micrograph of an example SiOC film deposited on a three dimensional feature by a PEALD process including MPTMS as a silicon precursor and a plasma generated from $H_2$ and Ar gas at a power of 67 W. The deposition temperature was 200° C. and the reaction chamber pressure was 4 Torr. The film was deposited by 1000 deposition cycles including MPTMS/purge/RF/purge times of 6/4/4/1 seconds. FIG. 9B is a scanning electron micrograph of the example SiOC film of FIG. 10A after being subjected to a 0.1 wt % dilute HF wet etch. It was observed that substantially no film remained on the sidewalls after the etch process.

Figure 10:
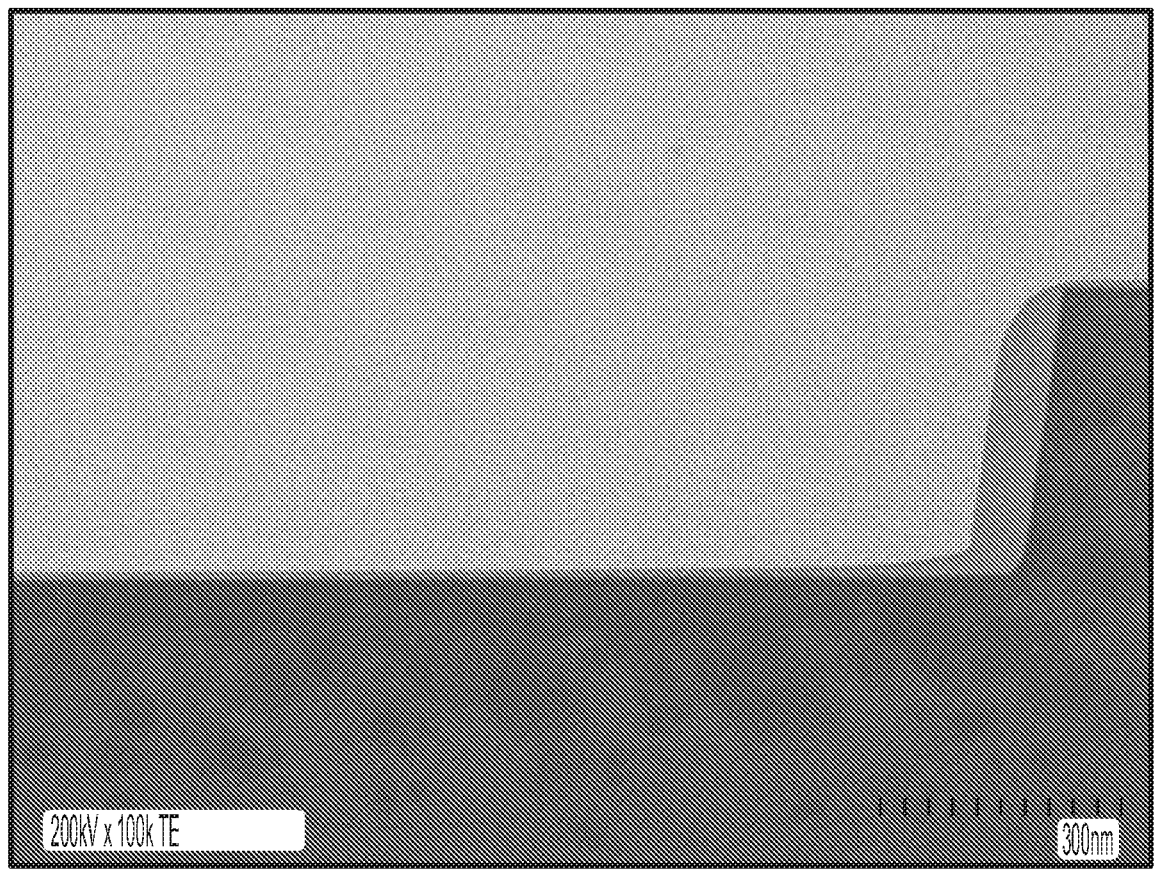
FIG. 10 is a a scanning electron micrograph of the example SiOC film deposited by a PEALD process with as plasma power of 650 W as described herein and according to some embodiments.

FIG. 10 is a scanning electron micrograph of an example SiOC film deposited on a three dimensional feature by a PEALD process including MPTMS as a silicon precursor and a plasma generated from $H_2$ and Ar gas at a power of 650 W. The deposition temperature was 200° C. and the reaction chamber pressure was 4 Torr. The film was deposited by 2000 deposition cycles including MPTMS/purge/RF/purge times of 2/4/4/0.5 seconds. It was observed that the film thickness on the sidewall was 63 nm while the thickness on the top surface was substantially lower, at only 8 nm.

In other experiments a post deposition plasma treatment (PT) was carried out on deposited SiOC films. SiOC was deposited on a trench pattern from 3-methoxypropyl (trimethoxysilane) (MPTMS) and hydrogen plasma at a deposition temperature of 200° C., essentially as described above. The SiOC film was subjected to a post deposition plasma treatment in which it was exposed to hydrogen plasma generated in Ar/$H_2$ gas at either 334 W or 835 W. As can be seen in Table 2 below, the thickness on the top of the trench decreased after the plasma treatment. However, it increased on the sidewall and bottom. The step coverage increased from 0.6 when no treatment was applied to 1 after the treatment with the plasma generated at 334 W and from 0.6 to 1.7 when the a power of 835 W was used. Without wishing to be held to any theory, it is believed that the SiOC film on the top of the structure was not etched away, but redeposited on the sidewall and the bottom of the trench.

TABLE 2

|        | No PT | PT_334W | PT_835W |
|--------|-------|---------|---------|
| Top    | 32.0  | 28.1    | 20.9    |
| Side   | 20.4  | 27.8    | 35.8    |
| Bottom | 27.0  | 29.8    | 40.2    |

In addition, plasma post treatment (PT) using nitrogen, hydrogen and oxygen plasma was carried out on SiOC films deposited on trench structures as described above. Plasma was generated in each of $H_2$, $O_2$ and $N_2$ gases mixed with Ar gas. A power of 300 W was applied and the plasma treatment was repeated for 50 cycles, with a pulse (exposure) time of 6 seconds and a purge of 1 second between cycles. Following plasma treatment with each of the three plasma reactants, the wet etch rate (WER) in dilute HF was measured. As shown in Table 3, below, the wet etch rate of the sidewall was improved by the oxygen plasma treatment and the nitrogen plasma treatment, but not by the hydrogen plasma treatment.

TABLE 3

| PT | Power (W) | Cycles | Pulse time (s) | Purge time (s) | WER on sidewall (nm/min) |
|----|-----------|--------|----------------|----------------|--------------------------|
| PT_$H_2$&Ar | 300 | 50 | 6 | 1 | 4.92 |
| PT_$O_2$&Ar | 300 | 50 | 6 | 1 | 2.46 |
| PT_$N_2$&Ar | 300 | 50 | 6 | 1 | 1.8  |
| No PT       | —   | —  | — | — | 4.1  |

Figure 11A:
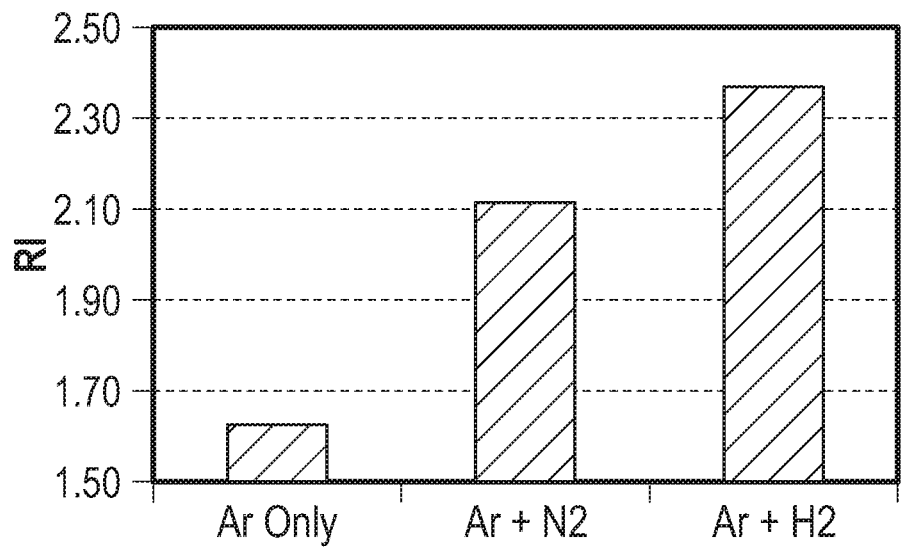
FIG. 11A is a graph showing the refractive index (R.I.) of TiO(CN) films deposited using titanium isopropoxide (IV) using different plasma reactants.
Figure 11B:
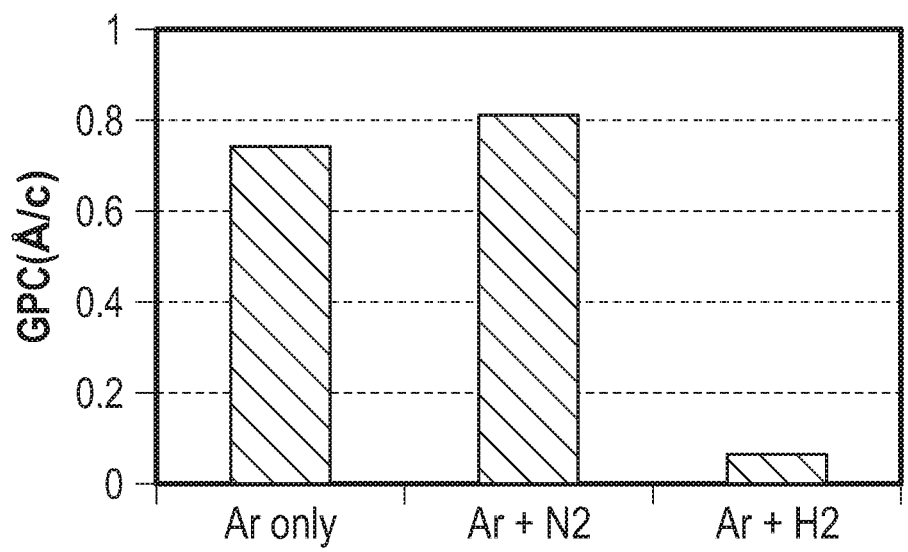
FIG. 11B is a graph showing the growth rate per cycle of TiO(CN) films deposited using titanium isopropoxide (IV) using different plasma reactants.

Titanium oxide thin films were deposited in a direct plasma PEALD reactor by an oxygen-free PEALD process using titanium isopropoxide (IV) (TTIP) as the titanium precursor. TTIP was provided from a source bottle heated at 70° C. The TTIP reacatant was provided alternately and sequentially with three different plasma reactants. A plasma was generated in Ar, Ar and $N_2$, and Ar and $H_2$. Experiments were carried out at a deposition temperature of 200° C. FIG. 11A shows the refractive index of the resulting films. In the case of $H_2$-containing plasma, the refractive index is very close to that of $TiO_2$. However, the $N_2$-containing plasma and pure Ar plasma showed different refractive indices, indicating variable film composition. FIG. 11B shows the growth rate of the titanium oxide films using the three different plasma reactants.

Table 4, below, shows composition data derived from RBS and XZPS. Both XPS and RBS indicate that $TiO_2$ films are deposited by $H_2$-containing plasma. No crystalline structure was seen by XRD measurement. Indicating that amorphous $TiO_2$ was deposited. The wet etch rate ratio (WERR) relative to thermal silicon oxide (TOX) in 0.5% dHF solution was about 0.5. This low WERR makes the films useful in some patterning applications. Four point probe resistivity measurements indicated extremely high resistivity of deposited $TiO_2$ films.

When pure Ar plasma was used as the plasma reactant, the resultant film was a carbon rich TiOC film. The carbon content may be modified by tuning plasma power. Additionally, $N_2$ containing plasma introduced nitrogen into the films, resulting in a TiOCN film.

TABLE 4

|     | Ti (%) | O (%) | C (%) | N (%) |
|-----|--------|-------|-------|-------|
| TTIP + AR PLASMA | | | | |
| RBS | 5.6    | 12.5  | 81.9  | —     |
| XPS | 4.3    | 14.0  | 81.7  | —     |
| TTIP + AR&H PLASMA | | | | |
| RBS | 35     | 65    | —     | —     |
| XPS | 33.9   | 66.1  | —     | —     |
| TTIP + AR&N PLASMA | | | | |
| RBS | 9.6    | 21.5  | 34.2  | 34.7  |
| XPS | 9.2    | 20.8  | 28.9  | 36.1  |

As used herein, the term "about" may refer to a value that is within 15%, within 10%, within 5%, or within 1% of a given value.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method for controlling a step coverage of a silicon oxycarbide (SiOC) thin film on a three dimensional feature of a substrate comprising depositing the SiOC thin film on the three-dimensional feature of the substrate by a plasma enhanced atomic layer deposition (PEALD) process comprising at least one deposition cycle comprising:
    contacting the substrate with a vapor phase silicon precursor that comprises oxygen; and
    contacting the substrate with a second reactant comprising reactive species from a plasma generated in a gas that does not comprise oxygen at a plasma power of 100 W to 650 W,
    wherein SiOC thin film has a step coverage on the three dimensional feature of about 20% to about 1000%, and
    wherein the three dimensional feature has an aspect ratio of from about 1 to about 10.

2. The method of claim 1, additionally comprising removing excess vapor phase silicon precursor after contacting the substrate with the vapor phase silicon precursor and prior to contacting the substrate with the second reactant.

3. The method of claim 1, wherein the deposition cycle is repeated to form a SiOC film of the desired thickness.

4. The method of claim 1, wherein the vapor phase silicon precursor comprises oxygen and no other reactant used in the deposition cycle comprises oxygen.

5. The method of claim 1, wherein the silicon precursor comprises at least one alkoxy group.

6. The method of claim 5, wherein the silicon precursor comprises 3-methoxypropyltrimethoxysilane (MPTMS).

7. The method of claim 1, wherein the second reactant comprises hydrogen atoms, hydrogen radicals, or hydrogen ions.

8. The method of claim 1, wherein a ratio of a wet etch rate of the SiOC film formed on a vertical surface of the three dimensional feature to a wet etch rate of the SiOC film formed on a horizontal surface of the three dimensional feature of from about 0.2 to about 15.

9. The method of claim 1, further comprising exposing the deposited SiOC film to at least one reactive species generated by a plasma formed in a gas comprising $H_2$, $N_2$, $O_2$, $N_2O$, NO, $NO_2$, $NH_3$, CO, $CO_2$, or $H_2O$.

10. The method of claim 9, wherein exposing the deposited SiOC film to the at least one reactive species reduces a wet etch rate (WER) of the SiOC film on a vertical surface of the three-dimensional feature.

11. The method of claim 9, wherein exposing the deposited SiOC film to the at least one reactive species reduces a thickness of the SiOC film on a horizontal surface of the three-dimensional feature and increases the thickness of the SiOC film deposited on a vertical surface of the three-dimensional feature.

12. The method of claim 1, further comprising etching the deposited SiOC, wherein etching the deposited SiOC removes substantially all of the deposited SiOC from a vertical surface of the three-dimensional feature and does not remove substantially all of the SiOC from a horizontal surface of the three-dimensional feature.

13. A process for selectively forming SiOC on a first horizontal surface of a three dimensional feature on a substrate relative to a second vertical surface of the three dimensional feature, the process comprising:
    depositing SiOC on a horizontal surface and a vertical surface of the three dimensional feature by a plasma enhanced atomic layer deposition (PEALD) process comprising alternately and sequentially contacting the substrate with a silicon precursor that comprises oxygen and a second reactant comprising plasma formed in a gas that comprises hydrogen and does not comprise oxygen, wherein the SiOC deposited on the horizontal surface has an etch rate lower than an etch rate of the SiOC deposited on the vertical surface; and
    etching the deposited SiOC, wherein etching the deposited SiOC removes substantially all of the deposited SiOC from the vertical surface and does not remove substantially all of the SiOC from the horizontal surface.

14. The process of claim 13, wherein the silicon precursor comprises a silicon alkoxide.

15. The process of claim 13, wherein the plasma is formed in a gas comprising $H_2$ and Ar.

16. The process of claim 13, wherein etching the deposited SiOC comprises exposing the deposited SiOC to 0.5 wt % dilute HF for a desired duration.

17. The process of claim 13, wherein etching the deposited SiOC comprises exposing the deposited SiOC to radicals, ions, plasma or a combination thereof.

18. A method for controlling a step coverage of a silicon oxycarbide (SiOC) thin film formed by a plasma enhanced atomic layer deposition (PEALD) process on a three dimensional feature of a substrate, wherein the PEALD process comprises at least one deposition cycle comprising:
    contacting the substrate with a vapor phase silicon alkoxide;
    contacting the substrate with a second reactant comprising plasma generated at a plasma power of about 200 W to about 650 W in a gas comprising hydrogen and not oxygen,
    wherein the plasma power is selected to produce a SiOC thin film having a step coverage on the three dimensional feature of 20% or greater, and
    wherein the three dimensional feature has an aspect ratio of from about 1 to about 3.

* * * * *

UNITED STATES PATENT AND TRADEMARK OFFICE
CERTIFICATE OF CORRECTION

PATENT NO. : 11,158,500 B2
APPLICATION NO. : 16/603555
DATED : October 26, 2021
INVENTOR(S) : Jia et al.

It is certified that error appears in the above-identified patent and that said Letters Patent is hereby corrected as shown below:

On the Title Page

Page 4, Column 1, (Other Publications), Line 3, delete "transconductant" and insert --transconductance--.

Page 4, Column 2, (Other Publications), Line 17, delete "Zeitscrift" and insert --Zeitschrift--.

Page 5, Column 2, (Other Publications), Line 53, delete "(triethoxylsilyl)" and insert --(triethoxysilyl)--.

In the Specification

Column 1, Line 54, delete "form" and insert --from--.

Column 3, Line 45, delete "a a" and insert --a--.

Column 6, Line 23, delete "5" and insert --$5^{th}$--.

Column 9, Line 28, delete "chamber" and insert --chamber.--.

Column 17, Line 35, delete "to to" and insert --to--.

Column 17, Line 37, delete "the a" and insert --the--.

Column 17, Line 47, delete "a an" and insert --an--.

Column 20, Line 7, delete "100%," and insert --100%.--.

Column 22, Line 19 (approx.), delete "$Si(OR)_3$" and insert --$Si(OR^{II})_3$--.

Signed and Sealed this
Seventeenth Day of May, 2022

*Katherine Kelly Vidal*
*Director of the United States Patent and Trademark Office*

CERTIFICATE OF CORRECTION (continued)
U.S. Pat. No. 11,158,500 B2

Column 22, Line 31, delete "R and R" and insert --$R^I$ and $R^{II}$--.

Column 22, Line 39 (approx.), delete "$R^{II}_2$" and insert --$R^I_2$--.

Column 24, Line 13, delete "$R^I$" and insert --$R^{III}$--.

Column 24, Line 33, delete "y=." and insert --y=0.--.

Column 24, Line 38, after "3-mercaptopropyltriethoxysilane" insert --.--.

Column 25, Line 19 (approx.), delete "$Si(OR^I)_{4-x-y}$" and insert --$Si(OR^I)_{4-x-y-z}$--.

Column 25, Line 19 (approx.), delete "$(OH)_x$" and insert --$(OH)_z$--.

Column 25, Line 31 (approx.), delete "$(R^{II}NR^{III}R^{IV})$" and insert --$(R^{II}NR^{III}R^{IV})_x$--.

Column 25, Line 60, delete "R" and insert --$R^{II}$--.

Column 28, Line 26, delete "25 at % to" and insert --25 at %--.

Column 28, Line 34, delete "(112/" and insert --($H_2$/--.

Column 29, Line 32, delete "$N_2Ha$," and insert --$N_2H_4$,--.

Column 29, Line 63, delete "30 at/o," and insert --30 at %,--.

Column 30, Line 23, delete "3" and insert --3.--.

Column 32, Line 45, delete "a a" and insert --a--.

Column 32, Line 52, delete "in in" and insert --in--.

Column 35, Line 37, delete "SOC." and insert --SiOC.--.

Column 39, Line 5, delete "TrIP" and insert --TTIP--.

Column 40, Line 12, delete "SSiOC" and insert --SiOC--.

Column 40, Line 29, delete "1-3 at. %." and insert --1-3 at %.--.

Column 40, Line 66, delete "the a" and insert --the--.

Column 41, Line 40 (approx.), delete "reacatant" and insert --reactant--.